US009754657B2

(12) United States Patent
Onuki et al.

(10) Patent No.: US 9,754,657 B2
(45) Date of Patent: Sep. 5, 2017

(54) SEMICONDUCTOR DEVICE, MEMORY DEVICE, ELECTRONIC DEVICE, AND METHOD FOR DRIVING SEMICONDUCTOR DEVICE

(71) Applicant: Semiconductor Energy Laboratory Co., Ltd., Atsugi-shi, Kanagawa-ken (JP)

(72) Inventors: Tatsuya Onuki, Kanagawa (JP); Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/153,360

(22) Filed: May 12, 2016

(65) Prior Publication Data

US 2016/0336057 A1    Nov. 17, 2016

(30) Foreign Application Priority Data

May 14, 2015    (JP) .................................. 2015-098701

(51) Int. Cl.
*G11C 11/24*    (2006.01)
*G11C 11/409*    (2006.01)
(Continued)

(52) U.S. Cl.
CPC ............ *G11C 11/409* (2013.01); *G11C 11/24* (2013.01); *G11C 11/404* (2013.01);
(Continued)

(58) Field of Classification Search
CPC ............... G11C 11/401–11/4099; G11C 11/22
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Han Yang
(74) *Attorney, Agent, or Firm* — Fish & Richardson P.C.

(57) ABSTRACT

A novel semiconductor device, a semiconductor device capable of storing multi-level data, a semiconductor device with low power consumption, a semiconductor device with a reduced area, or a highly reliable semiconductor device is provided. The semiconductor device includes a memory cell which includes a first transistor and a capacitor, and a second transistor. The first transistor includes an oxide semiconductor in a channel formation region. One of a source and a drain of the first transistor is electrically connected to a first wiring. The other of the source and the drain of the first transistor is electrically connected to one of electrodes of the capacitor. The other of the electrodes of the capacitor is electrically connected to a second wiring. A gate of the second transistor is electrically connected to the first wiring.

15 Claims, 31 Drawing Sheets

(51) Int. Cl.
  *H01L 29/786* (2006.01)
  *H01L 27/12* (2006.01)
  *G11C 11/56* (2006.01)
  *G11C 11/404* (2006.01)
  *G11C 11/4097* (2006.01)
  *H01L 27/108* (2006.01)
  *H01L 27/1156* (2017.01)

(52) U.S. Cl.
  CPC .......... *G11C 11/4097* (2013.01); *G11C 11/56* (2013.01); *G11C 11/565* (2013.01); *H01L 27/124* (2013.01); *H01L 27/1225* (2013.01); *H01L 27/1255* (2013.01); *H01L 29/7869* (2013.01); *H01L 27/10805* (2013.01); *H01L 27/1156* (2013.01)

(58) Field of Classification Search
  USPC ........................... 365/149, 145, 49.11
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,614,916 B2 | 12/2013 | Nagatsuka et al. |
| 8,854,865 B2 | 10/2014 | Saito |
| 8,953,358 B2 | 2/2015 | Nishijima et al. |
| 9,218,870 B2 | 12/2015 | Saito |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0118597 A1* | 5/2010 | Song ................... G11C 11/405 365/149 |
| 2012/0057397 A1* | 3/2012 | Ohnuki .............. G11C 11/5628 365/149 |
| 2012/0281469 A1* | 11/2012 | Tomatsu ............ H01L 27/1156 365/182 |
| 2015/0340094 A1 | 11/2015 | Tamura |
| 2016/0027782 A1 | 1/2016 | Saito |
| 2016/0104521 A1 | 4/2016 | Onuki et al. |
| 2016/0329336 A1 | 11/2016 | Shionoiri |
| 2016/0336055 A1 | 11/2016 | Kato |
| 2016/0336059 A1 | 11/2016 | Matsuzaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2012-256400 A | 12/2012 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—$ZnO$ system at 1350° C", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In-Ga-Zn-Oxide TFTS With a Novel Passivation Layer", SID Digest '09 : SID International Symposium Digest of Technical Papers, May 31, 2009, pp. 284-287.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B(Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In-Ga-Zn-Oxide TFTS", IDW '09: Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08: SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.
Tsuda.K et al., "Ultra Low Power Consumption Technologies for Mobile TFT-LCDs", IDW '02: Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 13A
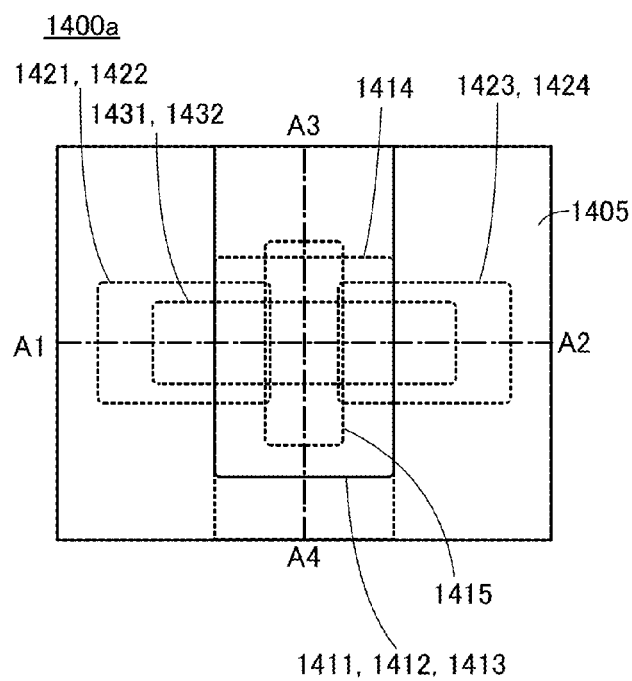
FIG. 13B
FIG. 13C
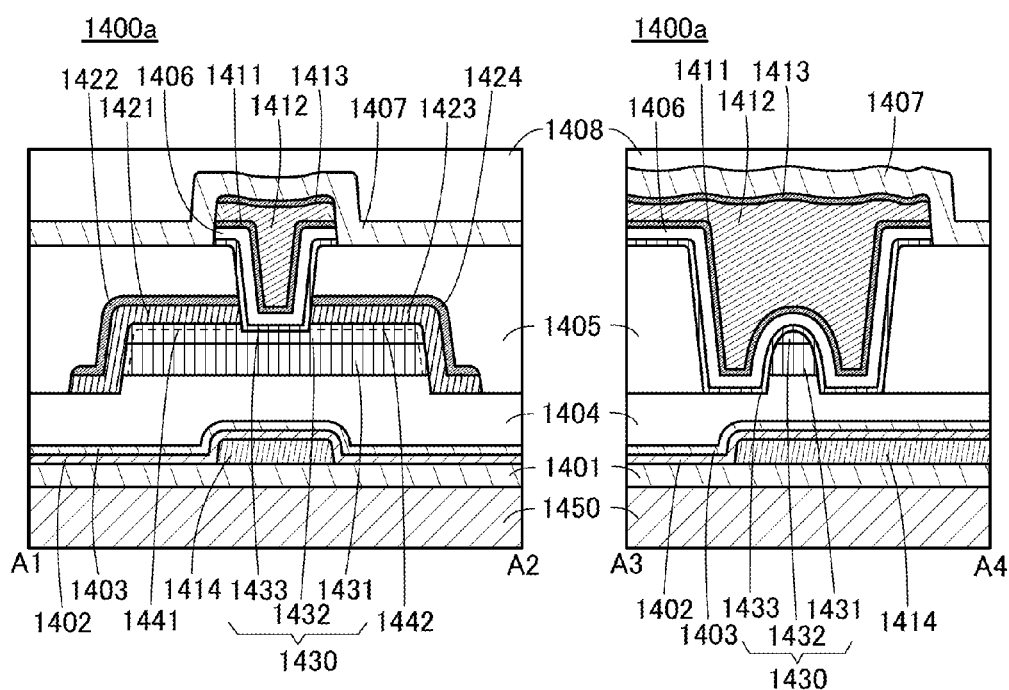

FIG. 20A
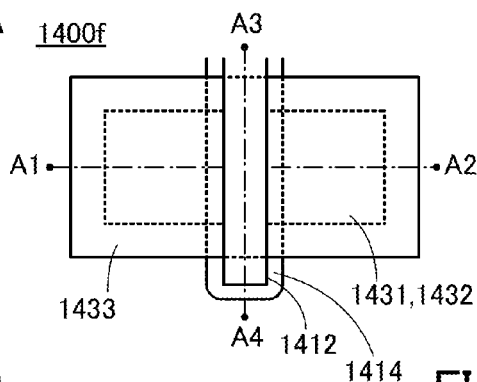
FIG. 20B
FIG. 20C
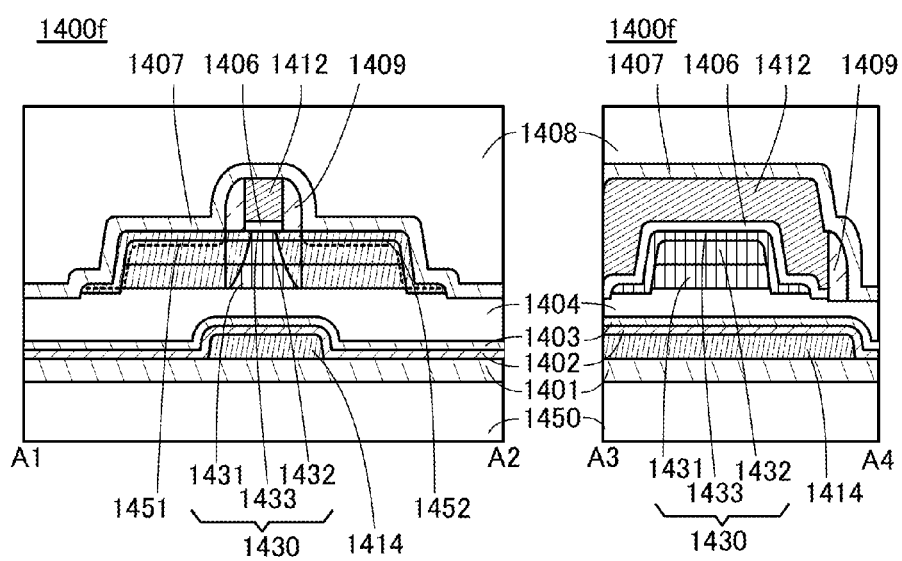
FIG. 20D
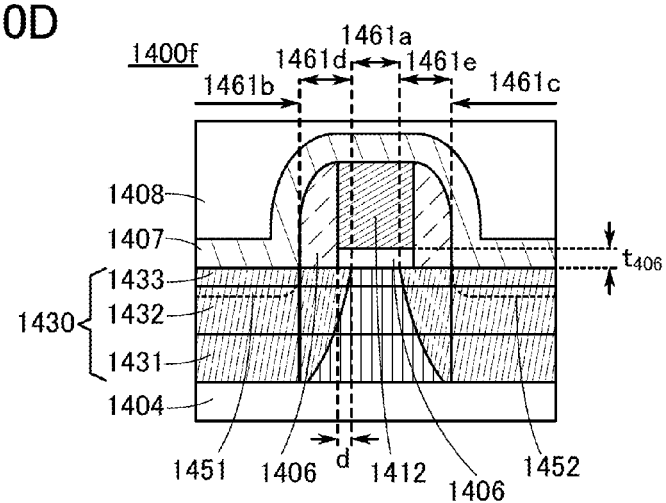

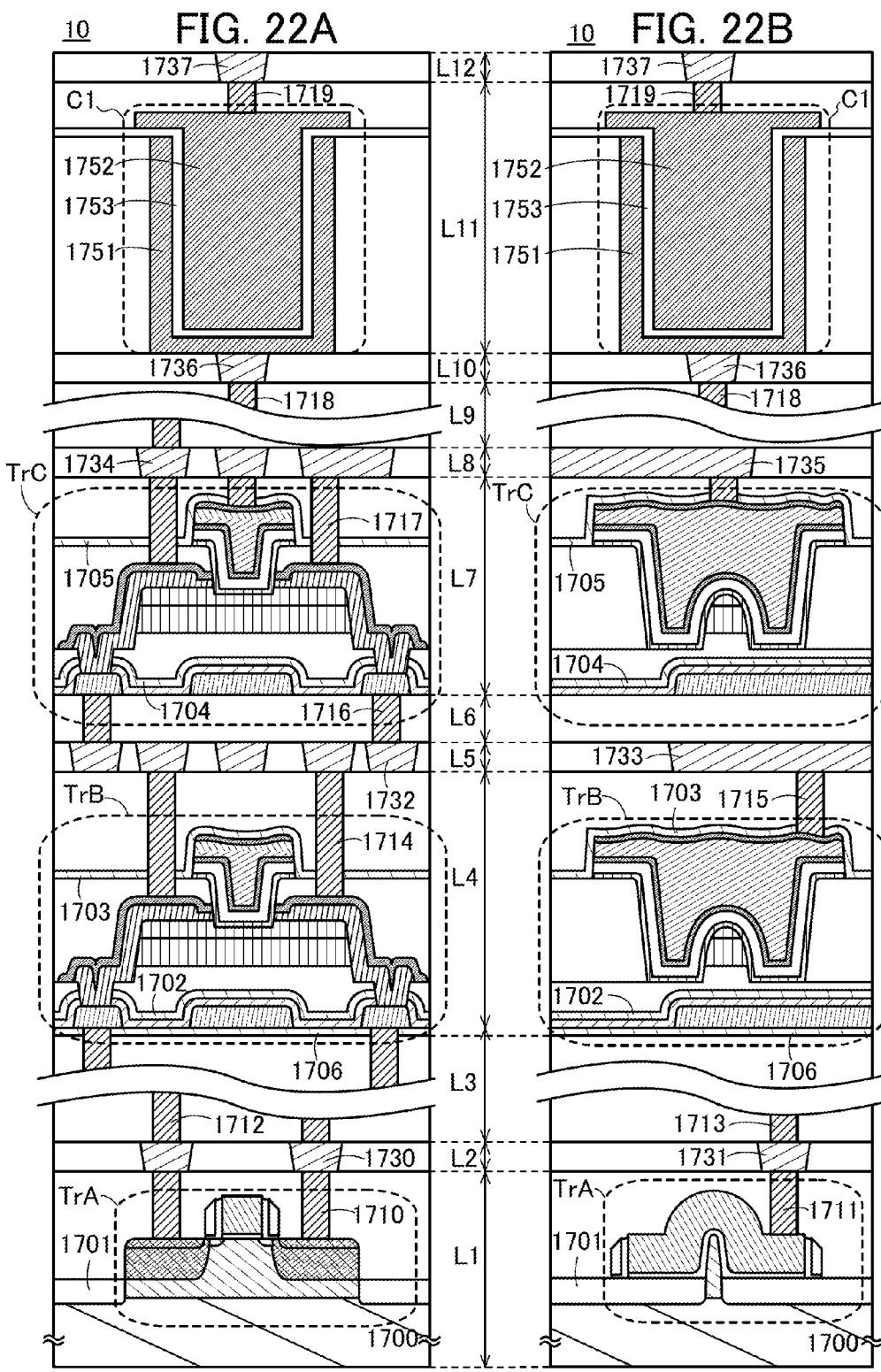

FIG. 23A
FIG. 23B
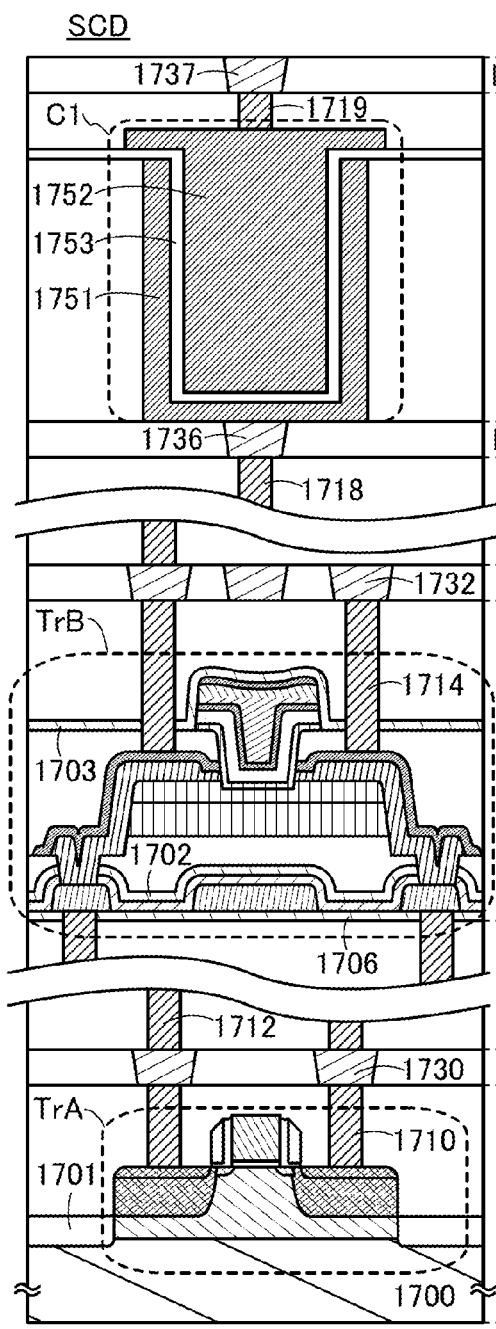
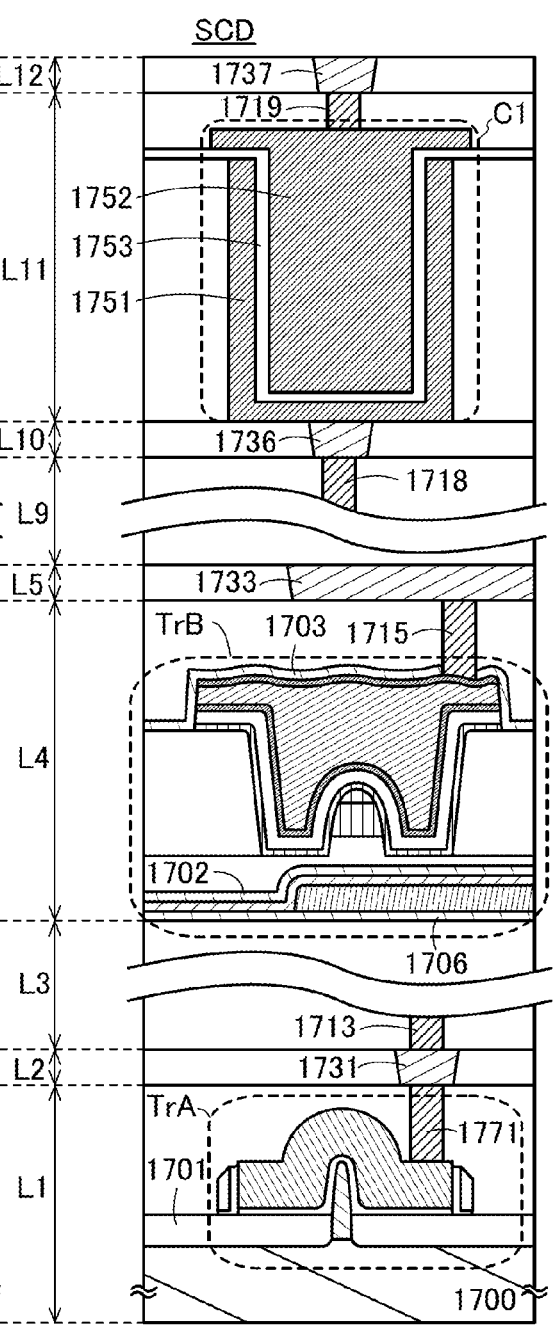

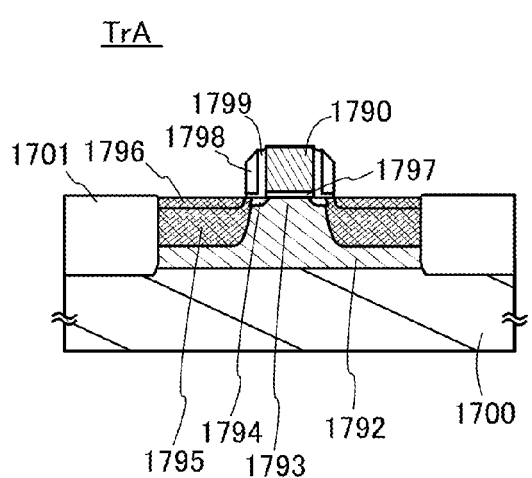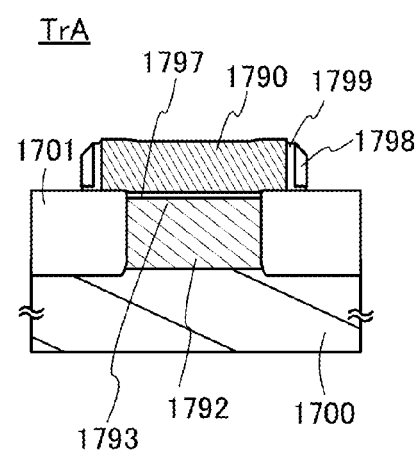
FIG. 25A
FIG. 25B

4000

4000

4000

4000

4000

4000

SEMICONDUCTOR DEVICE, MEMORY DEVICE, ELECTRONIC DEVICE, AND METHOD FOR DRIVING SEMICONDUCTOR DEVICE

BACKGROUND OF THE INVENTION

1. Field of the Invention

One embodiment of the present invention relates to a semiconductor device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. One embodiment of the present invention relates to a semiconductor device, a display device, a light-emitting device, a power storage device, a memory device, an imaging device, a driving method thereof, or a manufacturing method thereof.

2. Description of the Related Art

Patent Document 1 describes a memory device that includes a transistor using an oxide semiconductor and a transistor using single crystal silicon. According to Patent Document 1, the transistor using an oxide semiconductor has an extremely low off-state current.

REFERENCE

[Patent Document 1] Japanese Published Patent Application No. 2012-256400

SUMMARY OF THE INVENTION

An object of one embodiment of the present invention is to provide a novel semiconductor device or a novel memory device. Another object of one embodiment of the present invention is to provide a semiconductor device or a memory device capable of storing multi-level data. Another object of one embodiment of the present invention is to provide a semiconductor device or a memory device with low power consumption. Another object of one embodiment of the present invention is to provide a semiconductor device or a memory device with a reduced area. Another object of one embodiment of the present invention is to provide a highly reliable semiconductor device or a highly reliable memory device.

One embodiment of the present invention does not necessarily achieve all the objects listed above and only needs to achieve at least one of the objects. The descriptions of the above objects do not disturb the existence of other objects. Other objects will be apparent from and can be derived from the description of the specification, the drawings, the claims, and the like.

A semiconductor device according to one embodiment of the present invention includes a memory cell which includes a first transistor and a capacitor, and a second transistor. The first transistor includes an oxide semiconductor in a channel formation region. One of a source and a drain of the first transistor is electrically connected to a first wiring. The other of the source and the drain of the first transistor is electrically connected to one of electrodes of the capacitor. The other of the electrodes of the capacitor is electrically connected to a second wiring. A gate of the second transistor is electrically connected to the first wiring. The second wiring has a function of transmitting a first potential based on data to be written to the memory cell. The semiconductor device has a function of performing a first operation of supplying a predetermined potential to the one of the electrodes of the capacitor by turning on the first transistor and has a function of performing a second operation of setting the potential of the one of the electrodes of the capacitor to a third potential based on the first potential by turning off the first transistor after the first operation and by changing the potential of the second wiring from the first potential to a second potential.

In the semiconductor device according to one embodiment of the present invention, one of a source and a drain of the second transistor may be electrically connected to a third wiring, and the semiconductor device may have a function of performing a third operation of setting the potential of the first wiring to a fourth potential based on the third potential and setting the potential of the third wiring to a potential based on the fourth potential by turning on the first transistor.

In the semiconductor device according to one embodiment of the present invention, the data to be written to the memory cell may be two or more bits of data, and the semiconductor device may have a function of sequentially changing the potential of the second wiring in reading the data.

In the semiconductor device according to one embodiment of the present invention, the memory cell may be stacked over the second transistor.

In the semiconductor device according to one embodiment of the present invention, the capacitance of the capacitor may be larger than a parasitic capacitance added to the first wiring.

A memory device according to one embodiment of the present invention includes the above-described semiconductor device.

An electronic device according to one embodiment of the present invention includes the above-described semiconductor device or the above-described memory device and a display portion, a microphone, a speaker, or an operation key.

According to one embodiment of the present invention, a novel semiconductor device or a novel memory device can be provided. According to another embodiment of the present invention, a semiconductor device or a memory device capable of storing multi-level data can be provided. According to another embodiment of the present invention, a semiconductor device or a memory device with low power consumption can be provided. According to another embodiment of the present invention, a semiconductor device or a memory device with a reduced area can be provided. According to another embodiment of the present invention, a highly reliable semiconductor device or a highly reliable memory device can be provided.

Note that the descriptions of these effects do not disturb the existence of other effects. One embodiment of the present invention does not necessarily achieve all the effects. Other effects will be apparent from and can be derived from the descriptions of the specification, the drawings, the claims, and the like.

BRIEF DESCRIPTION OF THE DRAWINGS

FIGS. 13A to 13C are a top view and cross-sectional views illustrating a structural example of a transistor.

FIGS. 20A to 20D are a top view and cross-sectional views illustrating a structural example of a transistor.

FIGS. 22A and 22B are cross-sectional views illustrating a structural example of a memory cell.

FIGS. 23A and 23B are cross-sectional views illustrating a structural example of a memory cell.

FIGS. 25A and 25B are cross-sectional views illustrating a structural example of a transistor.

DETAILED DESCRIPTION OF THE INVENTION

Figure 1:
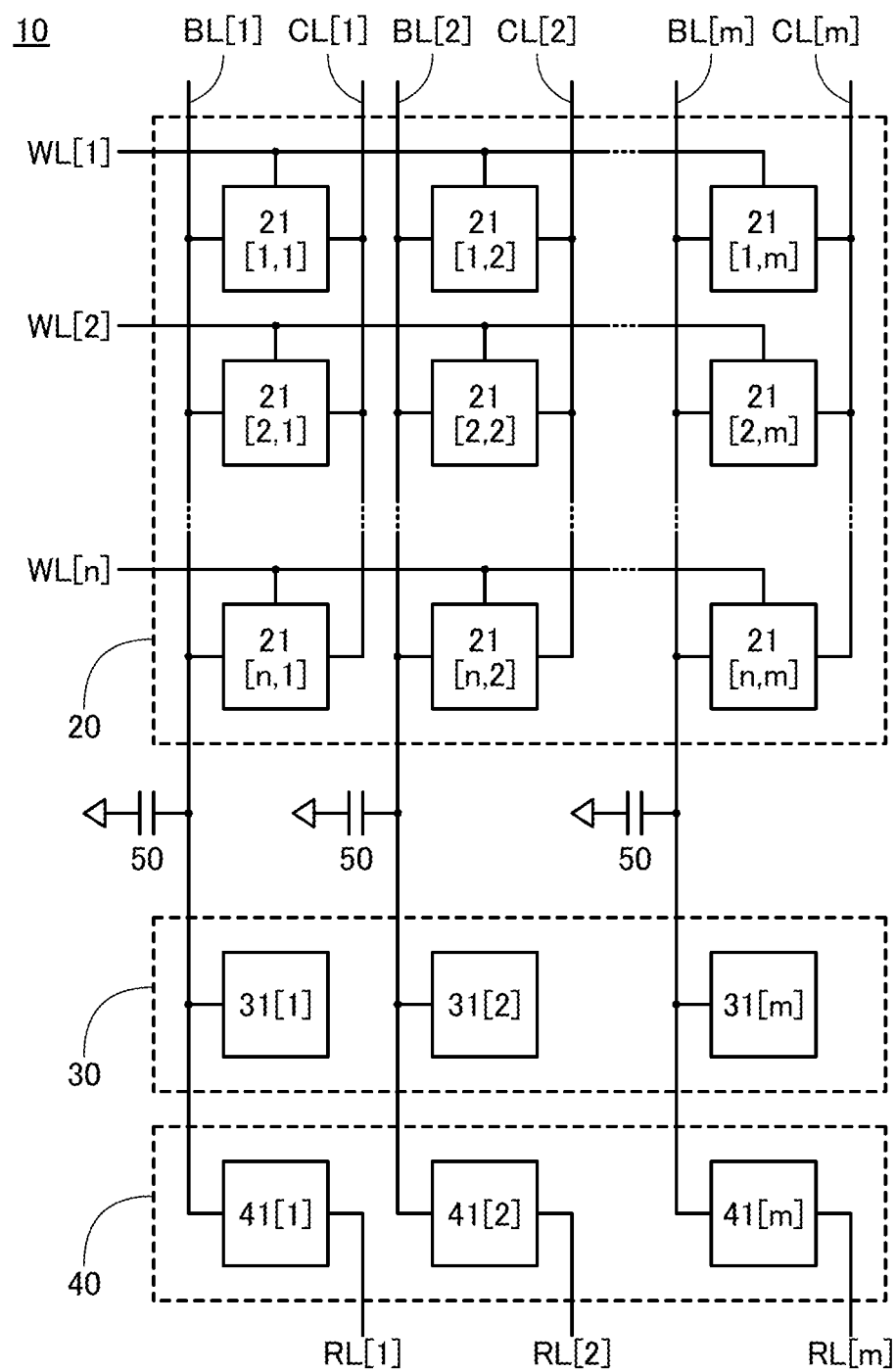
FIG. 1 illustrates one embodiment of a semiconductor device.

Embodiments of the present invention will be described in detail below with reference to the drawings. Note that the present invention is not limited to the description in the following embodiments, and it will be easily understood by those skilled in the art that various changes and modifications can be made without departing from the spirit and scope of the present invention. Therefore, the present invention should not be construed as being limited to the description in the following embodiments.

One embodiment of the present invention includes, in its category, devices such as a semiconductor device, a memory device, a radio frequency (RF) tag, a display device, an imaging device, and an integrated circuit. In addition, the display device includes, in its category, display devices including integrated circuits, such as liquid crystal display devices, light-emitting devices in which a light-emitting element typified by an organic light-emitting element is provided in each pixel, electronic paper, digital micromirror devices (DMDs), plasma display panels (PDPs), and field emission displays (FEDs).

Note that, in the description of modes of the invention with reference to the drawings, the same components in different diagrams are commonly denoted by the same reference numeral.

In this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected."

Even when independent components are electrically connected to each other in a diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a configuration example of a semiconductor device of one embodiment of the present invention will be described.

<Configuration of Semiconductor Device>

FIG. 1 illustrates a configuration example of a semiconductor device 10 of one embodiment of the present invention. The semiconductor device 10 includes a cell array 20, a control circuit 30, and a read circuit 40.

The cell array 20 includes a plurality of memory cells 21. In FIG. 1, the cell array 20 includes memory cells 21 (memory cells 21[1,1] to 21[n,m]) arranged in n rows and m columns (n and m are natural numbers). Since the cell array 20 includes the memory cells 21, the semiconductor device 10 can be used as a memory device.

Each of the memory cells 21 is a circuit having a function of storing data. The memory cell 21 is preferably configured to be capable of storing two or more bits of data (multi-level data), in which case the area per bit of the semiconductor device 10 can be reduced.

Each of the memory cells 21 is connected to a wiring WL, a wiring BL, and a wiring CL. The wiring WL has a function of transmitting a signal for selecting memory cells 21 in a predetermined row (this signal is hereinafter also referred to as a selection signal). The wiring BL has a function of transmitting a potential to be supplied to the memory cell 21 during a write operation and also has a function of transmitting a potential corresponding to data stored in the memory cell 21 (this potential is hereinafter also referred to as a read potential) during a read operation. The wiring CL has a function of transmitting a signal for controlling data writing to the memory cell 21 (this signal is hereinafter also referred to as a write control signal) and a signal for controlling data reading from the memory cell 21 (this signal is hereinafter also referred to as a read control signal).

Figure 2:
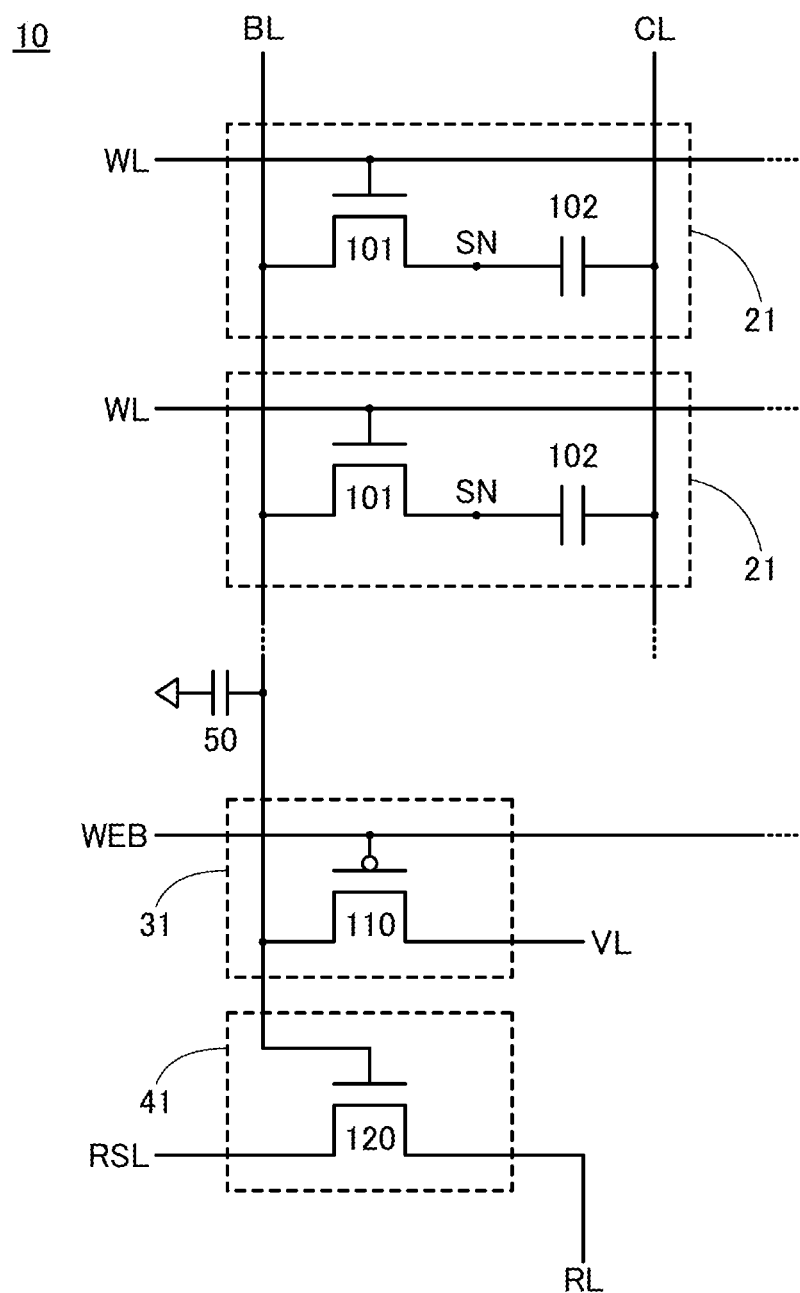
FIG. 2 illustrates one embodiment of a semiconductor device.

FIG. 2 illustrates a specific configuration example of the memory cell 21. The memory cell 21 includes a transistor 101 and a capacitor 102. A gate of the transistor 101 is connected to the wiring WL, one of a source and a drain of the transistor 101 is connected to one of electrodes of the capacitor 102, and the other of the source and the drain of the transistor 101 is connected to the wiring BL. The other of the electrodes of the capacitor 102 is connected to the wiring CL. Here, a node which is connected to the one of the source and the drain of the transistor 101 and the one of the electrodes of the capacitor 102 is referred to as a node SN.

A predetermined potential is supplied to the node SN from the wiring BL through the transistor 101. When the transistor 101 is in an off state, the node SN is in a floating state and thus the potential of the node SN is retained. Thus, the memory cell 21 can store data. Note that whether the transistor 101 is turned on or off can be controlled by a potential supplied to the wiring WL.

A transistor containing an oxide semiconductor in a channel formation region (this transistor is hereinafter also referred to as an OS transistor) is preferably used as the transistor 101. An oxide semiconductor has a wider band gap and a lower carrier density than other semiconductors such as silicon. Thus, the off-state current of the OS transistor is extremely low. Therefore, when the OS transistor is used as the transistor 101, a potential can be retained at the node SN for a long period. Thus, operation in which another writing is performed at predetermined intervals (refresh operation) is unnecessary or the frequency of the refresh operation can be extremely low. Moreover, even in a period in which the power supply to the memory cell 21 is stopped, data can be retained for a long period. Thus, power consumption of the semiconductor device 10 can be reduced. A case where an n-channel OS transistor is used as the transistor 101 is specifically described here.

One of i potentials (i is a natural number of 2 or more) can be retained at the node SN. Note that the value i can be freely set. For example, the potential retained at the node SN may be one of two (high- and low-level) potentials (i=2) or one of three or more potentials (i≥3). In the case where i≥3, the memory cell 21 stores multi-level data. For example, in the case where i=4, the memory cell 21 can store 2-bit data.

In the case where one of three or more potentials is retained at the node SN, the differences between the potentials to be retained are narrower than in the case where one of two potentials is retained. Therefore, even slight leakage of charge from the node SN might cause a change in data stored in the memory cell 21. However, since the off-state current of an OS transistor is extremely low, leakage of charge from the node SN can be significantly suppressed, and one of three or more potentials can be accurately retained at the node SN. Therefore, the transistor 101 is preferably an OS transistor particularly in the case where one of three or more potentials is to be retained at the node SN.

In addition, the OS transistor has a higher withstand voltage than a transistor whose channel formation region contains silicon (the transistor is hereinafter also referred to as a Si transistor). Therefore, when the transistor 101 is the OS transistor, the range of potentials to be retained at the node SN can be widened. Accordingly, the number of potentials to be retained at the node SN can be increased, and the amount of data to be stored in the memory cell 21 can be increased. Alternatively, the differences between potentials can be widened, and multi-level data can be accurately stored.

The control circuit 30 illustrated in FIG. 1 has a function of controlling the potential of the wiring BL. Specifically, the control circuit 30 includes a plurality of circuits 31 (circuits 31[1] to 31[m]), each of which has a function of supplying a predetermined potential to the wiring BL and a function of keeping the wiring BL in a floating state. Each wiring BL is provided with one circuit 31; accordingly, the potential of each wiring BL can be controlled individually.

The read circuit 40 has a function of reading data stored in the memory cells 21. Specifically, the read circuit 40 includes a plurality of circuits 41 (circuits 41[1] to 41[m]), each of which has a function of outputting a predetermined potential to a wiring RL in accordance with the potential of the wiring BL. Each wiring BL is provided with one circuit 41; accordingly, data can be read from the memory cells 21 row by row.

Although the configurations of the circuits 31 and 41 are not particularly limited, the circuits 31 and 41 can be formed with transistors or the like. FIG. 2 illustrates a specific configuration example of the circuits 31 and 41.

The circuit 31 includes a transistor 110. A gate of the transistor 110 is connected to a wiring WEB. One of a source and a drain of the transistor 110 is connected to the wiring BL. The other of the source and the drain of the transistor 110 is connected to a wiring VL. The wiring WEB has a function of transmitting a signal for supplying a predetermined potential to the wiring BL. The wiring VL is supplied with a constant potential. Note that the transistor 110 is a p-channel transistor and the wiring VL is supplied with a high power supply potential $V_{DD}$ in the example described here; however, the configuration of the circuit 31 is not limited thereto. The circuits 31 may be provided with respective wirings VL or may share one wiring with each other.

When the wiring WEB is set at a low-level potential and the transistor 110 is turned on, the high power supply potential $V_{DD}$ is supplied to the wiring BL from the wiring VL through the transistor 110 and the wiring BL is set at a high-level potential. When the wiring WEB is set at a high-level potential and the transistor 110 is turned off, the wiring BL is brought into a floating state.

The circuit 41 includes a transistor 120. A gate of the transistor 120 is connected to the wiring BL. One of a source and a drain of the transistor 120 is connected to the wiring RL. The other of the source and the drain of the transistor 120 is connected to a wiring RSL. The wiring RL has a function of transmitting a potential corresponding to data stored in the memory cell 21. The wiring RSL is supplied with a constant potential. Note that the transistor 120 is an n-channel transistor and the wiring RSL is supplied with a low power supply potential Vss (e.g., a ground potential) in the example described here; however, the configuration of the circuit 41 is not limited thereto. The circuits 41 may be provided with respective wirings RSL or may share one wiring with each other.

A read potential is output to the wiring BL in a state where the wiring RL is precharged to a high-level potential. Then, whether the transistor 120 is turned on or off is controlled in accordance with the potential of the wiring BL, and the potential of the wiring RL is determined. Specifically, in the case where a voltage between the wiring BL and the wiring RSL is higher than or equal to the threshold voltage of the transistor 120, the transistor 120 is turned on and the low power supply potential Vss is supplied to the wiring RL from the wiring RSL through the transistor 120. Accordingly, the potential of the wiring RL is set to a low-level potential. On the other hand, in the case where the voltage between the wiring BL and the wiring RSL is lower than the threshold voltage of the transistor 120, the transistor 120 is turned off and the potential of the wiring RL is kept at the high-level potential. Accordingly, a signal corresponding to the read potential output to the wiring BL from the memory cell 21 is output to the wiring RL.

When the circuit 41 is formed with the transistor 120, the configuration of the read circuit 40 can be significantly simplified. Therefore, an increase in the area of the semiconductor device 10 can be suppressed, and the manufacturing process of the semiconductor device 10 can be simplified.

The structures of the transistors 110 and 120 are not particularly limited. For example, an OS transistor may be used as each of the transistors 110 and 120 as well as the transistor 101, or a different transistor may be used. For example, a transistor whose channel formation region is formed in part of a substrate including a single crystal semiconductor (the transistor is hereinafter also referred to as a single crystal transistor) may be used as each of the transistors 110 and 120. As the substrate including a single crystal semiconductor, a single crystal silicon substrate, a single crystal germanium substrate, or the like can be used.

As each of the transistors 110 and 120, a transistor whose channel formation region is formed in a film including a semiconductor material other than an oxide semiconductor can also be used. For example, a transistor whose channel formation region is formed in a film including a non-single-crystal semiconductor such as amorphous silicon, microcrystalline silicon, polycrystalline silicon, amorphous germanium, microcrystalline germanium, or polycrystalline germanium can be used.

As the transistor 101, the above-described single crystal transistor or the above-described transistor whose channel formation region is formed in a film including a semiconductor material other than an oxide semiconductor can also be used.

Figure 3A:
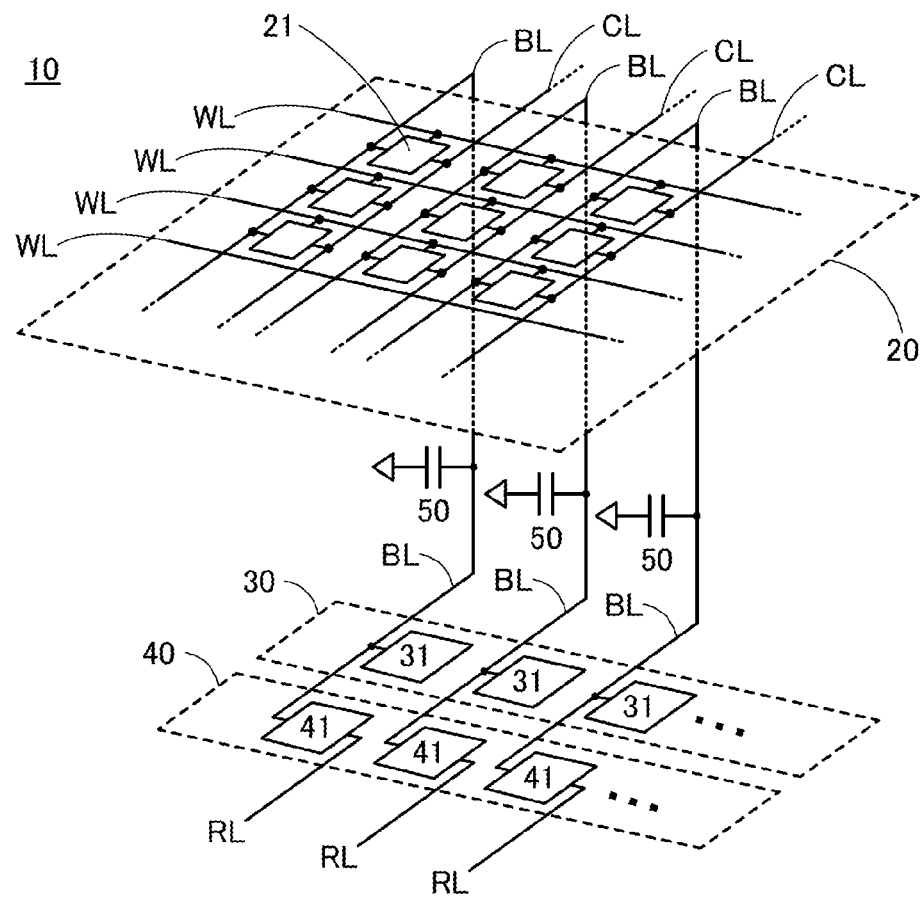
FIGS. 3A and 3B each illustrate one embodiment of a semiconductor device.

In the semiconductor device 10 illustrated in FIG. 1, the cell array 20 and the control and read circuits 30 and 40 are preferably stacked. FIG. 3A illustrates a structural example of the semiconductor device 10 in which the cell array 20 is stacked over the control circuit 30 and the read circuit 40 and the cell array 20 overlaps with the control circuit 30 and the read circuit 40. With such a structure, the control circuit 30 and the read circuit 40 can be provided in the semiconductor device 10 with no or a suppressed increase in the area of the semiconductor device 10.

Figure 3B:
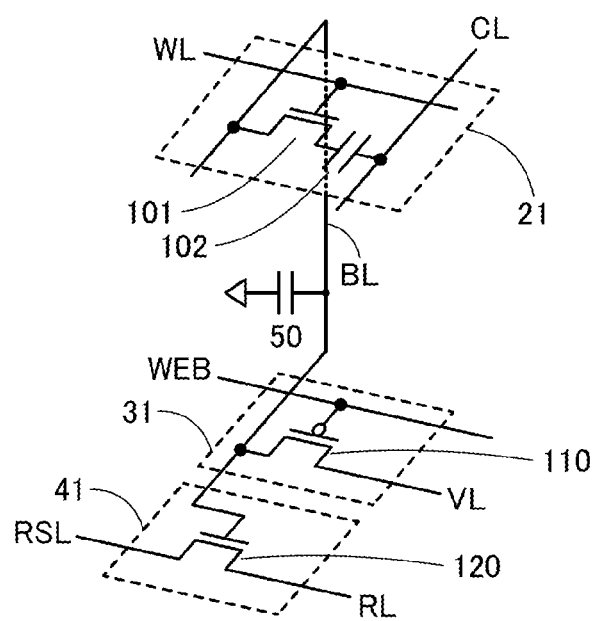

FIG. 3B illustrates a structure in which the memory cell 21 in FIG. 3A is stacked over the circuit 31 and the circuit 41. Here, the transistor 101 preferably overlaps with the transistor 110 or the transistor 120. With such a structure, the area of the semiconductor device 10 can be reduced.

Note that the phrase "a transistor has a region where the transistor overlaps with another transistor" means, for example, that the transistor has a region where a channel formation region, a gate electrode, a source electrode, or a drain electrode of the transistor overlaps with a channel formation region, a gate electrode, a source electrode, or a drain electrode of the other transistor. In other words, the phrase includes a case where the transistor has a region where channel formation regions, gate electrodes, source electrodes, or drain electrodes of the transistor and the other transistor overlap with each other.

As illustrated in FIG. 1, FIG. 2, and FIGS. 3A and 3B, a capacitor 50 is added to the wiring BL owing to another wiring, electrode, or the like. The capacitor 50 corresponds to a parasitic capacitance added to the wiring BL. Here, $C_s/C_b$, the ratio of the capacitance $C_s$ of the capacitor 102 in FIG. 2 to the capacitance $C_b$ of the capacitor 50, is a value which indicates the performance of the memory cell 21. A greater value of $C_s/C_b$ enables more high-speed and stable writing and reading to and from the memory cell 21 and is more advantageous for the memory cell 21 to be capable of storing multi-level data. A decrease in $C_b$ can increase the speed and stability of the memory cell 21. Alternatively, a decrease in $C_b$ can decrease $C_s$ with the value of $C_s/C_b$ maintained and can reduce the area of the capacitor 102.

In order to decrease $C_b$, it is preferable that the number of memory cells 21 connected to one wiring BL be small and the wiring BL be short. For example, $C_b$ can be decreased by dividing the cell array 20 and halving the number of memory cells 21 connected to one wiring BL. However, the number of cell arrays 20 is doubled in that case. In addition, the numbers of control circuits 30 and read circuits 40 included in the semiconductor device 10 are also doubled because each cell array 20 needs one control circuit 30 and one read circuit 40. Therefore, a decrease in the number of memory cells 21 connected to one wiring BL might result in an increase in the area of the semiconductor device 10. In one embodiment of the present invention, there is no or a small increase in the area of the semiconductor device 10 due to the presence of the control circuit 30 and the read circuit 40 because the cell array 20 can be stacked over the control circuit 30 and the read circuit 40 as illustrated in FIG. 3A. Thus, an increase in the area of the semiconductor device 10 can be suppressed, and at the same time, the cell array 20 can be divided to decrease the number of memory cells 21 connected to one wiring BL and make the wiring BL short. Accordingly, the capacitance $C_b$ of the capacitor 50 added to the wiring BL can be decreased. Note that the number of memory cells 21 connected to one wiring BL can be reduced to, for example, 2 to 8.

<Operation of Semiconductor Device>

Next, operation of the semiconductor device 10 will be described. Specifically, an operation example of multi-level data writing and reading to and from the memory cell 21 illustrated in FIG. 2 will be described below.

[Data Writing]

First, a potential corresponding to data to be written to the memory cell 21 (this potential is hereinafter also referred to as a write potential) is supplied to the wiring CL. For example, in the case where the memory cell 21 stores four-level data, any of four potentials $V_1$, $V_2$, $V_3$, and $V_4$ ($V_1 > V_2 > V_3 > V_4$) is selected and supplied to the wiring CL. The potential of the wiring WEB is set to a low-level potential, and a predetermined potential (here, a high-level potential) is supplied to the wiring BL. Note that the potential of the wiring BL is higher than or equal to $V_1$ in this example. A selection signal is supplied to the wiring WL to turn on the transistor 101. Accordingly, the high-level potential is supplied from the wiring BL to the node SN.

Next, the potential of the wiring WL is set to a potential at which the transistor 101 is turned off, so that the transistor 101 is turned off. This makes the node SN floating, and the potential of the node SN is retained.

Next, the potential of the wiring CL is set to a low-level potential. Note that the potential of the wiring CL is lower than or equal to $V_4$ in this example. The amount of change in the potential of the wiring CL at that time varies depending on the write potential. For example, the amount of change in the potential from the potential $V_1$ to the low-level potential is larger than the amount of change in the potential from the potential $V_2$ to the low-level potential. Since the node SN at that time is in a floating state, the potential of the node SN changes in accordance with a change in the potential of the wiring CL by capacitive coupling due to the capacitor 102. That is, the potential of the node SN becomes a potential based on the write potential supplied to the wiring CL. The potential of the node SN after the potential of the wiring CL is changed from $V_1$, $V_2$, $V_3$, or $V_4$ to the low-level potential is denoted by $V_1'$, $V_2'$, $V_3'$, or $V_4'$ ($V_1' < V_2' < V_3' < V_4'$). Accordingly, the potential based on the write potential supplied to the wiring CL is retained at the node SN. Thus, multi-level data writing is performed.

As described above, multi-level data can be written to the memory cell 21 by supplying a write control signal to the wiring CL and controlling the potential of the node SN.

[Data Reading]

Next, the operation of reading data from the memory cell 21 will be described. First, the potential of the wiring WEB is set to a low-level potential and the potential of the wiring BL is precharged to a high-level potential. Then, the potential of the wiring WEB is set to a high-level potential and the wiring BL is brought into a floating state. After that, a selection signal is supplied to the wiring WL to turn on the transistor 101. Accordingly, the wiring BL is electrically connected to the node SN.

When the wiring BL is electrically connected to the node SN, the capacitor 102 and the capacitor 50 are added to the wiring BL and charge accumulated in the capacitor 102 is distributed. As a result, the potential of the wiring BL varies depending on the potential retained at the node SN. The potential of the wiring BL and the node SN after charge distribution in the case where the potential retained at the node SN is $V_1'$, $V_2'$, $V_3'$, or $V_4'$ is denoted by $V_1''$, $V_2''$, $V_3''$, or $V_4''$ ($V_1'' < V_2'' < V_3'' < V_4''$).

When the capacitance $C_s$ of the capacitor 102 is larger than the capacitance $C_b$ of the capacitor 50, the amount of change in potential due to charge distribution (a change from $V_1'$, $V_2'$, $V_3'$, or $V_4'$ to $V_1''$, $V_2''$, $V_3''$, or $V_4''$) can be small. Therefore, the area of electrodes of the capacitor 102 is preferably larger than the area of electrodes of the capacitor 50. Alternatively, the thickness of a dielectric of the capacitor 102 is preferably smaller than the thickness of a dielectric of the capacitor 50.

Next, with the wiring RSL set at a constant potential (here, a low-level potential), the wiring RL is precharged to a predetermined potential (here, a high-level potential). In the case where the voltage between the wiring BL and the wiring RSL is higher than or equal to the threshold voltage of the transistor 120, the transistor 120 is turned on and the potential of the wiring RL is set to the low-level potential. On the other hand, in the case where the voltage between the wiring BL and the wiring RSL is lower than the threshold voltage of the transistor 120, the transistor 120 remains off and the potential of the wiring RL is kept at the high-level potential. Therefore, the potential of the wiring BL after charge distribution can be determined by reading the potential of the wiring RL.

In the case where the memory cell 21 stores multi-level data, a read control signal is supplied to the wiring CL and the above-described operation is performed. Specifically, charge distribution is performed first, and then, the potential of the wiring CL is increased from the low-level potential to $V_4$. At that time, the potential of the wiring BL is increased by capacitive coupling due to the capacitor 102. Then, the potential of the wiring RL after the potential of the wiring BL is increased is read. Thus, data stored in the memory cell 21 is read. Note that there is no need to increase the potential of the wiring CL when the low-level potential is $V_4$.

In the case where the wiring RL is at the low-level potential, the potential stored at the node SN can be determined to be $V_4'$, and in the case where the wiring RL is kept at the high-level potential, the potential stored at the node SN can be determined to be $V_2'$, or $V_3'$. In the case where the wiring RL is at the low-level potential when the potential of the wiring CL is $V_4$, the potential of the wiring CL is kept at $V_4$ in the subsequent reading operation.

In the case where the wiring RL is kept at the high-level potential, the potential of the wiring CL is increased from $V_4$ to $V_3$. At that time, the potential of the wiring BL is increased by capacitive coupling due to the capacitor 102. Then, the potential of the wiring RL after the potential of the wiring BL is increased is read. Thus, data stored in the memory cell 21 is read. Specifically, in the case where the wiring RL is at the low-level potential, the potential stored at the node SN can be determined to be $V_3'$, and in the case where the wiring RL is kept at the high-level potential, the potential stored at the node SN can be determined to be $V_1'$ or $V_2'$. In the case where the wiring RL is at the low-level potential when the potential of the wiring CL is $V_3$, the potential of the wiring CL is kept at $V_3$ in the subsequent reading operation.

In the case where the wiring RL is kept at the high-level potential, the potential of the wiring CL is increased from $V_3$ to $V_2$. At that time, the potential of the wiring BL is increased by capacitive coupling due to the capacitor 102. Then, the potential of the wiring RL after the potential of the wiring BL is increased is read. Thus, data stored in the memory cell 21 is read. Specifically, in the case where the wiring RL is at the low-level potential, the potential stored at the node SN can be determined to be $V_2'$, and in the case where the wiring RL is kept at the high-level potential, the potential stored at the node SN can be determined to be $V_1'$. In the case where the wiring RL is at the low-level potential when the potential of the wiring CL is $V_2$, the potential of the wiring CL is kept at $V_2$ in the subsequent reading operation. On the other hand, in the case where the wiring RL remains at the high-level potential when the potential of the wiring CL is $V_2$, the potential of the wiring CL is increased to $V_1$.

As described above, multi-level data stored in the memory cell 21 can be read by supplying a read control signal to the wiring CL to sequentially change the potential and reading the potential of the wiring RL at that time. Although the operation example in which the potential of the wiring CL is sequentially increased is described above, the potential of the wiring CL may be sequentially decreased to perform reading.

[Data Write-Back]

Next, data write-back to the memory cell 21 will be described. Data reading from the memory cell 21 illustrated in FIG. 2 is destructive reading in which charge accumulated in the node SN is released. Therefore, in the case where data is continuously retained after the read operation, an operation of writing read data to the memory cell 21 again (a write-back operation) is performed as described below.

First, after the read operation, the potential of the wiring WEB is set to the low-level potential and the potential of the wiring BL is set to the high-level potential. Note that the high-level potential is higher than or equal to $V_1$ in this example. Then, the potential of the wiring WL is set to a potential at which the transistor 101 is turned on, so that the transistor 101 is turned on. Accordingly, the high-level potential is supplied from the wiring BL to the node SN.

Next, the potential of the wiring WL is set to a potential at which the transistor 101 is turned off, so that the transistor 101 is turned off. This makes the node SN floating, and the potential of the node SN is retained.

The potential of the wiring CL after the read operation varies depending on the potential stored at the node SN. Specifically, in the case where the potential stored at the node SN is $V_1'$, $V_2'$, $V_3'$, or $V_4'$, the potential of the wiring CL is $V_1$, $V_2$, $V_3$, or $V_4$.

In this state, the potential of the wiring CL is changed to the low-level potential. Note that the low-level potential is lower than or equal to $V_4$ in this example. Thus, the potential of the node SN changes in accordance with a change in the potential of the wiring CL by capacitive coupling due to the capacitor 102. The potential of the node SN after the potential of the wiring CL is changed from $V_1$, $V_2$, $V_3$, or $V_4$ to the low-level potential is $V_1'$, $V_2'$, $V_3'$, or $V_4'$, as in the write operation. Accordingly, the same potential as that in the write operation is retained at the node SN. Thus, data write-back is performed.

As described above, multi-level data can be written back to the memory cell 21 by changing the potential of the wiring CL and controlling the potential of the node SN. There is no need of analog/digital conversion or digital/analog conversion in the above-described write-back operation. Therefore, the speed of the write-back operation can be increased, and the configuration of the semiconductor device 10 can be simplified.

[Operation Example]

Figure 4:
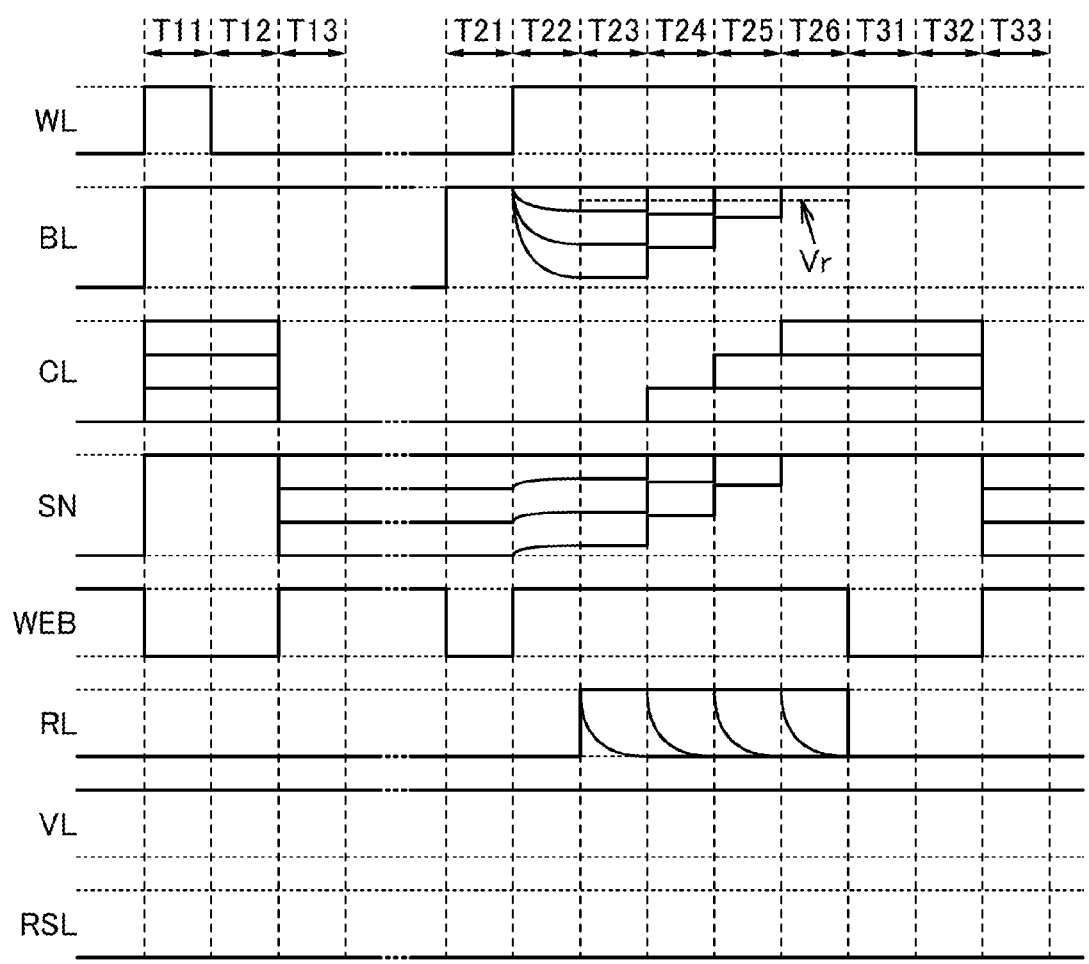
FIG. 4 is a timing chart.

Next, a specific operation example of the memory cell 21, the circuit 31, and the circuit 41 illustrated in FIG. 2 will be described using a timing chart of FIG. 4. Note that periods T11 to T13 are periods during which data is written to the memory cell 21; periods T21 to T26 are periods during which data is read from the memory cell 21; and periods T31 to T33 are periods during which data is written back to the memory cell 21. As one example, an operation of four-level data writing and reading to and from the memory cell 21 will be described here.

First, in the period T11, the wiring CL is set at any of the potentials $V_1$, $V_2$, $V_3$, and $V_4$ ($V_1 > V_2 > V_3 > V_4$). The potential of the wiring WEB is set to a low-level potential, and the potential of the wiring BL is set to a high-level potential (here, the potential $V_1$). The potential of the wiring WL is set to a high-level potential to turn on the transistor 101. Accordingly, the potential $V_1$ of the wiring BL is supplied to the node SN. Note that the potential of the wiring CL in the period T11 corresponds to the write potential.

Next, in the period T12, the potential of the wiring WL is set to a low-level potential to turn off the transistor 101. This makes the node SN floating, and the potential of the node SN is retained.

Then, in the period T13, the potential of the wiring CL is set to a low-level potential (here, $V_4$). At that time, the potential of the node SN changes to any of the potentials $V_1'$, $V_2'$, $V_3'$, and $V_4'$ ($V_1' < V_2' < V_3' < V_4'$), which correspond respectively to the potentials $V_1$, $V_2$, $V_3$, and $V_4$, by capacitive coupling due to the capacitor 102. Accordingly, the potential based on the write potential supplied to the wiring CL is retained at the node SN. Thus, data writing to the memory cell 21 is performed.

Then, in the period T21, the potential of the wiring WEB is set to the low-level potential, and the potential of the wiring BL is precharged to the high-level potential (here, the potential $V_1$). Note that the potential of the wiring CL is kept at $V_4$.

Next, in the period T22, the potential of the wiring WEB is set to a high-level potential to make the wiring BL floating. The potential of the wiring WL is set to the high-level potential to turn on the transistor 101. Accordingly, the wiring BL is electrically connected to the node SN, charge accumulated in the capacitor 102 is distributed, and the potentials of the wiring BL and the node SN are changed. The potential of the wiring BL and the node SN at that time is changed to any of the potentials $V_1''$, $V_2''$, $V_3''$, and $V_4''$ ($V_1'' < V_2'' < V_3'' < V_4''$), which correspond respectively to the potentials $V_1'$, $V_2'$, $V_3'$, and $V_4'$ of the node SN in the period T13. In the example given here, the potential $V_1$ of the wiring BL which is precharged in the period T21 and the potential $V_4'$ of the node SN in the period T13 are at the same level and $V_4'$ is equal to $V_4''$.

Next, in the period T23, the wiring RL is precharged to a high-level potential. At that time, the potential of the wiring RL changes depending on whether the transistor 120 is turned on or off. Specifically, assuming that the transistor 120 is turned on when the potential of the wiring RSL is constant (a low-level potential) and the potential of the gate of the transistor 120 is higher than or equal to $V_r$, the potential of the wiring RL changes from the high-level potential to a low-level potential when the potential of the wiring BL is higher than or equal to $V_r$. In the case where the potential of the wiring BL is lower than $V_r$, the potential of the wiring RL is kept at the high level.

In the period T23, the potential of the wiring RL is set to the low-level potential when the potential of the wiring BL is $V_4''$ ($\geq V_r$), and the potential of the wiring RL is kept at the high level when the potential of the wiring BL is $V_1''$ ($<V_r$), $V_2''$ ($<V_r$), or $V_3''$ ($<V_r$). Thus, whether the potential retained in the memory cell 21 is $V_4'$ or not can be determined by reading the potential of the wiring RL in the period T23. The potential of the wiring CL in the periods T24 to T26 is kept at $V_4$ in the case where the potential of the wiring RL becomes the low-level potential in the period T23.

In the case where the wiring RL is at the high-level potential in the period T23, the potential of the wiring CL is increased from $V_4$ to $V_3$ in the period T24. At that time, the potentials of the node SN and the wiring BL are increased by capacitive coupling due to the capacitor 102. The potential of the wiring BL after an increase from $V_1''$, $V_2''$, or $V_3''$ is denoted by $V_1'''$, $V_2'''$, or $V_3'''$.

When the potential of the wiring BL in the period T22 is $V_3''$, the potential of the wiring BL in the period T24 is $V_3'''$ ($\geq V_r$) and the potential of the wiring RL is the low-level potential. When the potential of the wiring BL in the period T22 is $V_1''$ or $V_2''$, the potential of the wiring BL in the period T24 is $V_1'''$ ($<V_r$) or $V_2'''$ ($<V_r$) and the potential of the wiring RL is kept at the high level. Thus, whether the potential retained in the memory cell 21 is $V_3'$ or not can be determined by reading the potential of the wiring RL in the period T24. The potential of the wiring CL in the periods T25 and T26 is kept at $V_3$ in the case where the potential of the wiring RL becomes the low-level potential in the period T24.

In the case where the wiring RL is at the high-level potential in the period T24, the potential of the wiring CL is increased from $V_3$ to $V_2$ in the period T25. At that time, the potentials of the node SN and the wiring BL are increased by capacitive coupling due to the capacitor 102. The potential of the wiring BL after an increase from $V_1'''$ or $V_2'''$ is denoted by $V_1''''$ or $V_2''''$.

When the potential of the wiring BL in the period T22 is $V_2''$, the potential of the wiring BL in the period T25 is $V_2''''$ ($\geq V_r$) and the potential of the wiring RL is the low-level potential. When the potential of the wiring BL in the period T22 is $V_1''$, the potential of the wiring BL in the period T25 is $V_1''''$ ($<V_r$) and the potential of the wiring RL is kept at the high level. Thus, whether the potential retained in the memory cell 21 is $V_1'$ or $V_2'$ can be determined by reading the potential of the wiring RL in the period T25. The potential of the wiring CL in the period T26 is kept at $V_2$ in the case where the potential of the wiring RL becomes the low-level potential in the period T25. On the other hand, in the case where the wiring RL is at the high-level potential in the period T25, the potential of the wiring CL is increased from $V_2$ to $V_1$ in the period T26.

As described above, the potential retained at the node SN in the period T13 can be determined to be $V_1'$, $V_2'$, $V_3'$, or $V_4'$ by sequentially changing the potential of the wiring CL and reading the potential of the wiring RL at that time. Accordingly, data reading from the memory cell 21 can be performed.

Next, in the period T31, the potential of the wiring WEB is set to the low-level potential, and the potential of the wiring BL is set to the high-level potential (here, the potential $V_1$). Accordingly, the potential $V_1$ of the wiring BL is supplied to the node SN.

Next, in the period T32, the potential of the wiring WL is set to the low-level potential to turn off the transistor 101. This makes the node SN floating, and the potential of the node SN is retained. Note that the potential of the wiring CL in the period T32 varies depending on the operation in the periods T23 to T26. Specifically, in the case where the potential stored at the node SN in the period T13 is $V_1'$, $V_2'$, $V_3'$, or $V_4'$, the potential of the wiring CL is $V_1$, $V_2$, $V_3$, or $V_4$.

Then, in the period T33, the potential of the wiring CL is set to the low-level potential (here, $V_4$). At that time, the potential of the node SN changes to any of the potentials $V_1'$, $V_2'$, $V_3'$, and $V_4'$, which correspond respectively to the potentials $V_1$, $V_2$, $V_3$, and $V_4$, by capacitive coupling due to the capacitor 102. Accordingly, the same potential as that in the period T13 is retained at the node SN. Thus, data write-back to the memory cell 21 is performed.

As described above, multi-level data writing, reading, and write-back can be controlled by supplying control signals to the wiring CL.

With the above-described configuration of one embodiment of the present invention, multi-level data writing to the memory cell 21 and multi-level data reading from the memory cell 21 can be performed.

In one embodiment of the present invention, the area of the semiconductor device 10 can be reduced by stacking the cell array 20 and the control and read circuits 30 and 40. In addition, the capacitance added to the wiring BL can be reduced, and the operating speed of the semiconductor device 10 can be increased. Such a configuration is also effective when two-level data is stored in the memory cell 21.

In one embodiment of the present invention, with the use of an OS transistor, data in the memory cell 21 can be retained for a long time, and the power consumption of the semiconductor device 10 can be reduced. With the use of the OS transistor, the range of potentials to be retained at the node SN can be widened. Accordingly, the amount of data to be stored in the memory cell 21 can be increased, and multi-level data can be accurately stored. Thus, a reduction in area and an improvement in reliability of the semiconductor device 10 can be achieved.

This embodiment can be combined with any of the other embodiments as appropriate.

Embodiment 2

In this embodiment, modification examples of a semiconductor device of one embodiment of the present invention will be described.

<Modification Example of Memory Cell 21>

Figure 5A:
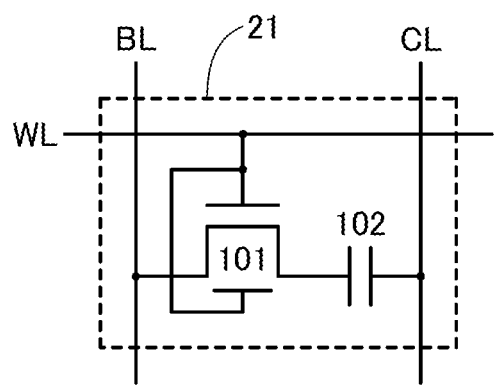
FIGS. 5A and 5B illustrate operation of one embodiment of a memory cell.
Figure 5B:
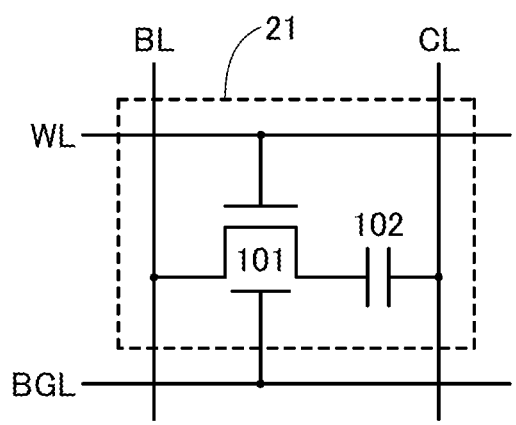

FIGS. 5A and 5B illustrate modification examples of the memory cell 21. Memory cells 21 illustrated in FIGS. 5A and 5B differ from the memory cell 21 in FIG. 2 in that the transistor 101 includes a pair of gates. That is, the transistors 101 in FIGS. 5A and 5B each have a structure obtained by providing the transistor 101 in FIG. 2 with a back gate.

In FIG. 5A, the back gate of the transistor 101 is connected to the gate of the transistor 101. In FIG. 5B, the back gate of the transistor 101 is connected to a wiring BGL. Note that the wiring BGL may be a wiring to which a fixed potential is supplied or a wiring to which two or more different potentials are supplied.

When the transistor 101 has a pair of gates between which a semiconductor film is positioned as illustrated in FIG. 5B, one of the gates may be supplied with a signal A, and the other gate may be supplied with a fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential (e.g., a ground potential). The signal A may be an analog signal.

The fixed potential $V_b$ is, for example, a potential for controlling the threshold voltage $V_{thA}$ of the transistor 101. The fixed potential $V_b$ may be the potential $V_1$ or the potential $V_2$. In this case, no additional potential generation circuit is necessary to generate the fixed potential $V_b$, which is preferable. The fixed potential $V_b$ may be a potential different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor 101 can be reduced in some cases. The fixed potential $V_b$ may be, for example, lower than the low power supply potential. When the fixed potential $V_b$ is high, the threshold voltage $V_{thA}$ can be low in some cases. As a result, the drain current flowing when the gate-source voltage $V_{gs}$ is $V_{DD}$ and the operating speed of the circuit including the transistor 101 can be increased in some cases. The fixed potential $V_b$ may be, for example, higher than the low power supply potential.

Alternatively, one of the gates of the transistor 101 may be supplied with the signal A, and the other gate may be supplied with a signal B. The signal B is, for example, a signal for controlling the on/off state of the transistor 101. The signal B may be a digital signal with two kinds of potentials, a potential $V_3$ and a potential $V_4$ ($V_3 > V_4$). For example, the potential $V_3$ may be a high power supply potential, and the potential $V_4$ may be a low power supply potential. The signal B may be an analog signal.

When both the signal A and the signal B are digital signals, the signal B may have the same digital value as the signal A. In this case, the on-state current of the transistor 101 and the operating speed of the circuit including the transistor 101 can be increased in some cases. Here, the potential $V_1$ of the signal A may be different from the potential $V_3$ of the signal B. Furthermore, the potential $V_2$ of the signal A may be different from the potential $V_4$ of the signal B. For example, if a gate insulating layer for the gate to which the signal B is input is thicker than a gate insulating layer for the gate to which the signal A is input, the potential amplitude of the signal B ($V_3 - V_4$) may be larger than the potential amplitude of the signal A ($V_1 - V_2$). In this manner, the influence of the signal A and that of the signal B on the on/off state of the transistor 101 can be substantially the same in some cases.

When both the signal A and the signal B are digital signals, the signal B may have a digital value different from that of the signal A. In this case, the signal A and the signal B can separately control the transistor 101, and thus, higher performance can be achieved. The transistor 101 which is, for example, an n-channel transistor can function by itself as a NAND circuit, a NOR circuit, or the like in the following case: the transistor 101 is turned on only when the signal A has the potential $V_1$ and the signal B has the potential $V_3$, or the transistor 101 is turned off only when the signal A has the potential $V_2$ and the signal B has the potential $V_4$. The signal B may be a signal for controlling the threshold voltage $V_{thA}$. For example, the potential of the signal B in a period where the circuit including the transistor 101 operates may be different from the potential of the signal B in a period where the circuit does not operate. The potential of the signal B may vary depending on the operation mode of the circuit. In this case, the potential of the signal B is not necessarily changed as frequently as the potential of the signal A.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor 101 and the operating speed of the circuit including the transistor 101. The signal B may have an analog value different from that of the signal A. In this case, the signal A and the signal B can separately control the transistor 101, and thus, higher performance can be achieved.

The signal A may be a digital signal, and the signal B may be an analog signal. Alternatively, the signal A may be an analog signal, and the signal B may be a digital signal.

Alternatively, one of the gates of the transistor 101 may be supplied with a fixed potential $V_a$, and the other gate may be supplied with the fixed potential $V_b$. When both of the gates of the transistor 101 are supplied with the fixed potentials, the transistor 101 can function as an element equivalent to a resistor in some cases. For example, when the transistor 101 is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

Although the structure of the transistor 101 including a pair of gates is described here, the transistor 110 and the transistor 120 in FIG. 2 may each similarly have a pair of gates.

<Modification Examples of Circuits 31 and 41>

Figure 6A:
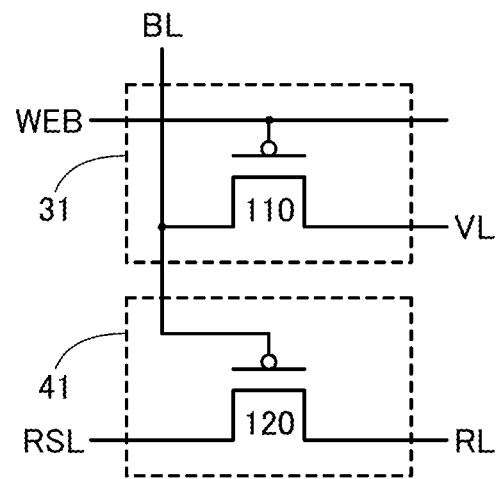
FIGS. 6A and 6B each illustrate operation of one embodiment of a circuit.
Figure 6B:
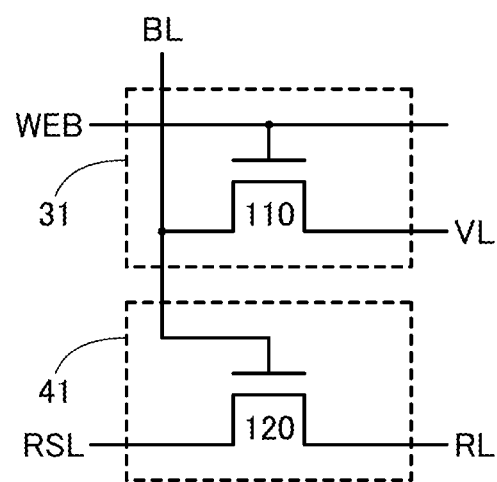

FIGS. 6A and 6B illustrate modification examples of the circuits 31 and 41.

The circuit 41 in FIG. 6A differs from that in FIG. 2 in that the transistor 120 is a p-channel transistor. In FIG. 6A, for example, with the potential of the wiring RSL set to a high-level potential, the wiring RL is precharged to a low-level potential during a read operation; thus, data stored in the memory cell 21 can be read. Other details of operations of the circuit 41 are similar to those in Embodiment 1.

The circuit 31 in FIG. 6B differs from that in FIG. 2 in that the transistor 110 is an n-channel transistor. In FIG. 6B, a low power supply potential VSS (e.g., a ground potential) can be supplied to the wiring VL. Then, data writing or write-back can be performed by supplying a low-level potential to the wiring BL. Data reading can be performed by precharging the wiring BL to a low-level potential. Other details of operations of the circuit 31 are similar to those in Embodiment 1.

When the transistor 110 and the transistor 120 have the same polarity as illustrated in FIG. 6A or 6B, the circuit 31 and the circuit 41 can be formed through the same process. Thus, the manufacturing process of the semiconductor device 10 can be simplified. When the transistor 110 or 120 and the transistor 101 are OS transistors and are formed in the same layer, the control circuit 30 or the read circuit 40 and the cell array 20 can be partly manufactured through a common process.

<Example of Stack Structure>

The semiconductor device 10 may have a structure in which the control circuit 30 and the read circuit 40 are formed in different layers and the memory cell 21, the circuit 31, and the circuit 41 are stacked. FIGS. 7A to 7D each illustrate an example of a structure in which the memory cell 21, the circuit 31, and the circuit 41 are stacked.

Figure 7A:
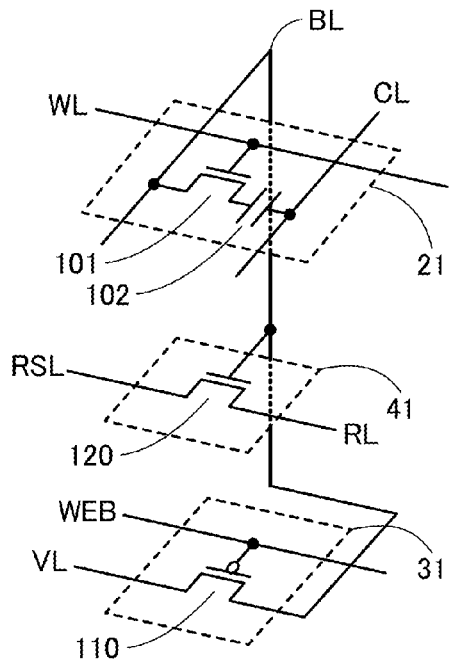
FIGS. 7A to 7D each illustrate one embodiment of a memory cell and a circuit.

FIG. 7A illustrates a structure example of the semiconductor device 10 including the circuit 41 over the circuit 31 and the memory cell 21 over the circuit 41. For example, the transistor 110 may be a single crystal transistor; the transistor 101 and the transistor 120 may be OS transistors; the transistor 120 may be provided over the transistor 110; and the transistor 101 may be provided over the transistor 120.

Figure 7B:
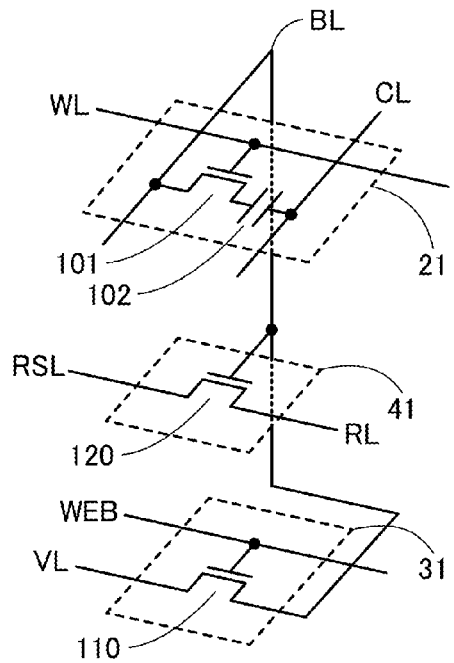

As illustrated in FIG. 7B, the transistor 110 may be an n-channel transistor, and all the transistors 101, 110, and 120 may be OS transistors. In that case, the semiconductor device 10 can be formed by stacking three layers each including the OS transistor.

When the transistor 120 is the OS transistor, the withstand voltage of the transistor 120 can be increased. Accordingly, the range of potentials to be supplied to the wiring BL connected to the gate of the transistor 120 can be widened, and an increase in the amount of data to be stored in the memory cell 21 and an improvement in reliability of multi-level data reading can be achieved.

Figure 7C:
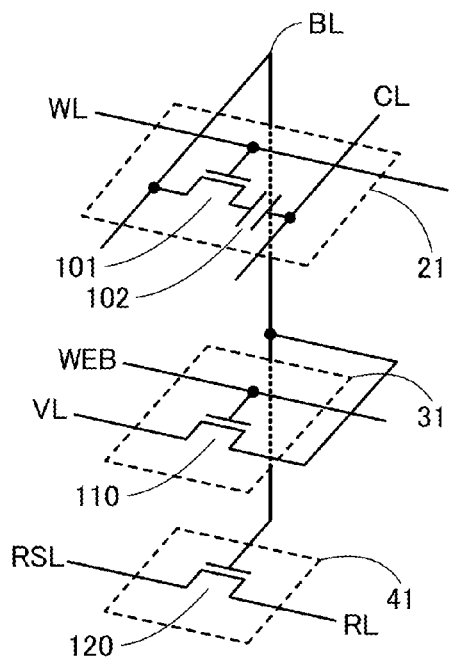
Figure 7D:
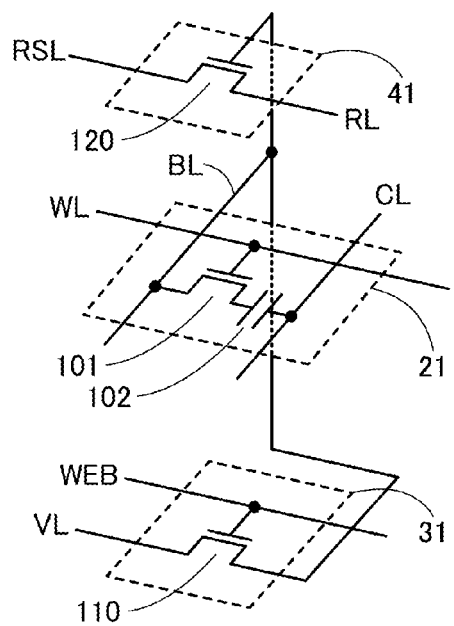

Note that the order of stacking the memory cell 21, the circuit 31, and the circuit 41 is not limited to the above examples and can be freely changed. For example, the circuit 31 may be provided between the memory cell 21 and the circuit 41 as illustrated in FIG. 7C, or the memory cell 21 may be provided between the circuit 31 and the circuit 41 as illustrated in FIG. 7D.

In FIGS. 7A to 7D, at least one of the transistors 101, 110, and 120 preferably has a region where it overlaps with another transistor, in which case the area of the semiconductor device 10 can be reduced. Alternatively, each of the transistors 101, 110, and 120 preferably has a region where it overlaps with the other two transistors, in which case the area of the semiconductor device 10 can be further reduced.

Figure 8:
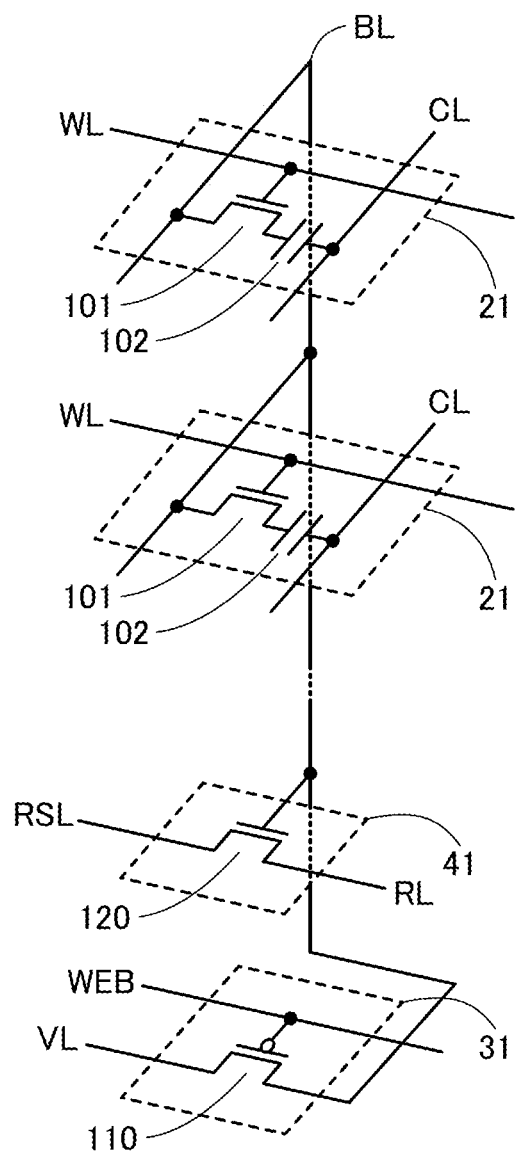
FIG. 8 illustrates one embodiment of a memory cell and a circuit.

As illustrated in FIG. 8, a plurality of memory cells 21 can be stacked. Thus, the area of the cell array 20 can be reduced. In that case, the transistor 101 of the memory cell 21 provided in one layer preferably has a region where it overlaps with the transistor 101 of the memory cell 21 provided in another layer.

As described above, the area of the semiconductor device 10 can be reduced by stacking circuits of the semiconductor device 10.

This embodiment can be combined with any of the other embodiments as appropriate.

Embodiment 3

In this embodiment, a memory device and a computer including the semiconductor device of one embodiment of the present invention will be described.

<Configuration Example of Memory Device>

Figure 9:
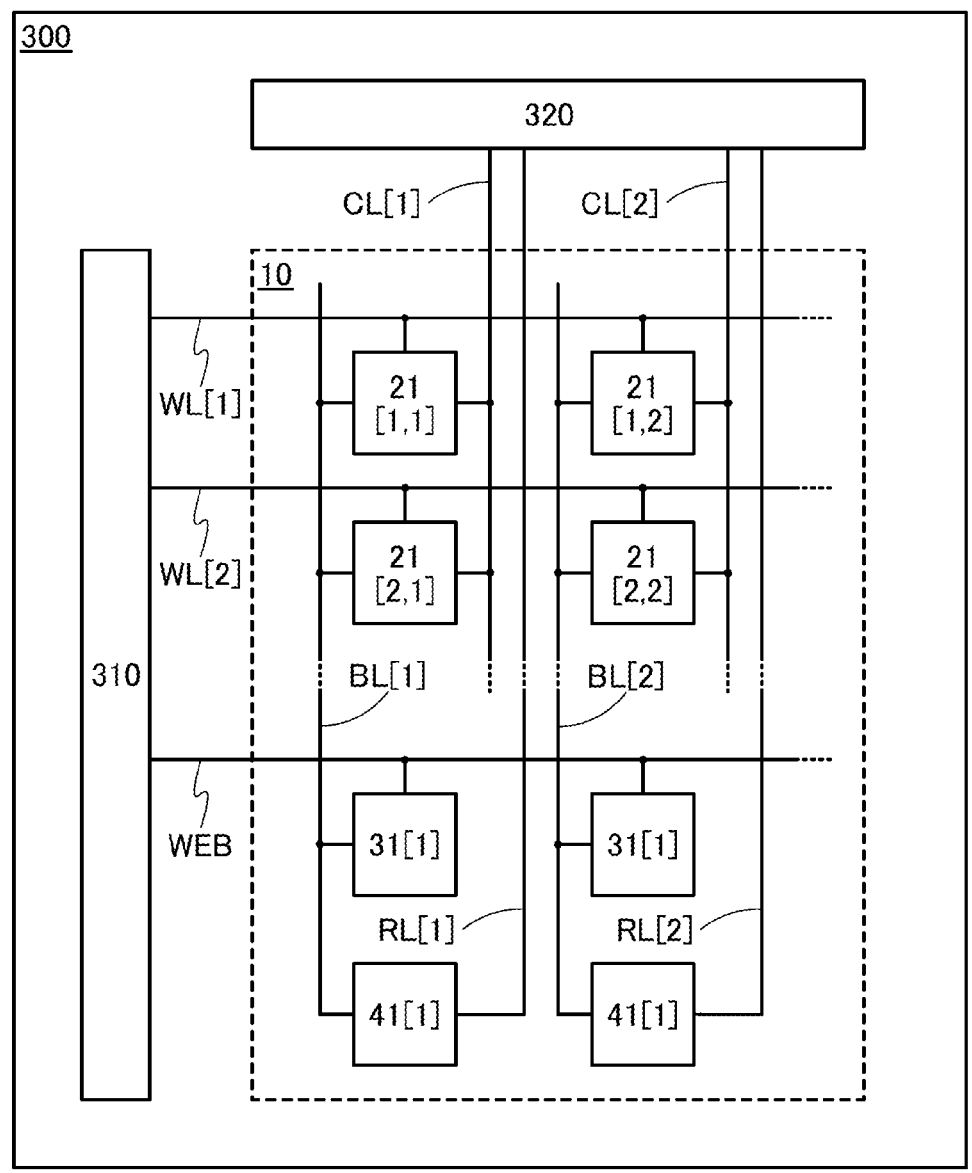
FIG. 9 illustrates one embodiment of a memory device.

FIG. 9 is a block diagram illustrating a configuration example of a memory device including the semiconductor device 10 described in the above embodiment.

A memory device 300 illustrated in FIG. 9 includes a row selection driver 310 and a column selection driver 320 in addition to the semiconductor device 10 described in the above embodiment.

The row selection driver 310 is a driver circuit having a function of selecting memory cells 21 in a predetermined row by supplying a selection signal to the wiring WL. The row selection driver 310 in the memory device 300 allows the memory cells 21 to be selected row by row and data to be written to and read from the selected memory cells 21. The row selection driver 310 also has a function of controlling the potential of the wiring BL by supplying a predetermined signal to the wiring WEB.

The column selection driver 320 is a driver circuit having a function of controlling data writing to the memory cells 21 or data reading from the memory cells 21 by supplying a write control signal or a read control signal to the wiring CL. The column selection driver 320 may have a function of precharging the potential of the wiring CL, a function of initializing the potential of the wiring CL, a function of making the wiring CL floating, and the like. Specifically, the column selection driver 320 is a circuit having a function of supplying a write potential corresponding to multi-level data, a precharge voltage $V_{precharge}$, an initialization voltage $V_{initial}$, and the like to the wiring CL through a switch. The column selection driver 320 in the memory device 300 allows the memory cells 21 to be selected column by column and data to be written to and read from the selected memory cells 21. Note that the column selection driver 320 does not need to have all the above-mentioned functions and may lack some of the functions as appropriate depending on the operation of the memory cells 21.

The column selection driver 320 also has a function of reading data stored in the memory cell 21 from the potential of the wiring RL. Data read by the column selection driver 320 may be used to generate a signal to be supplied to the wiring CL or may be output from the column selection driver 320 to the outside. Note that the wiring RL may be connected to a read circuit different from that connected to the column selection driver 320. In this case, the read circuit performs reading, outputting, or the like of data stored in the memory cell 21.

[Configuration Example of Row Selection Driver]

Figure 10:
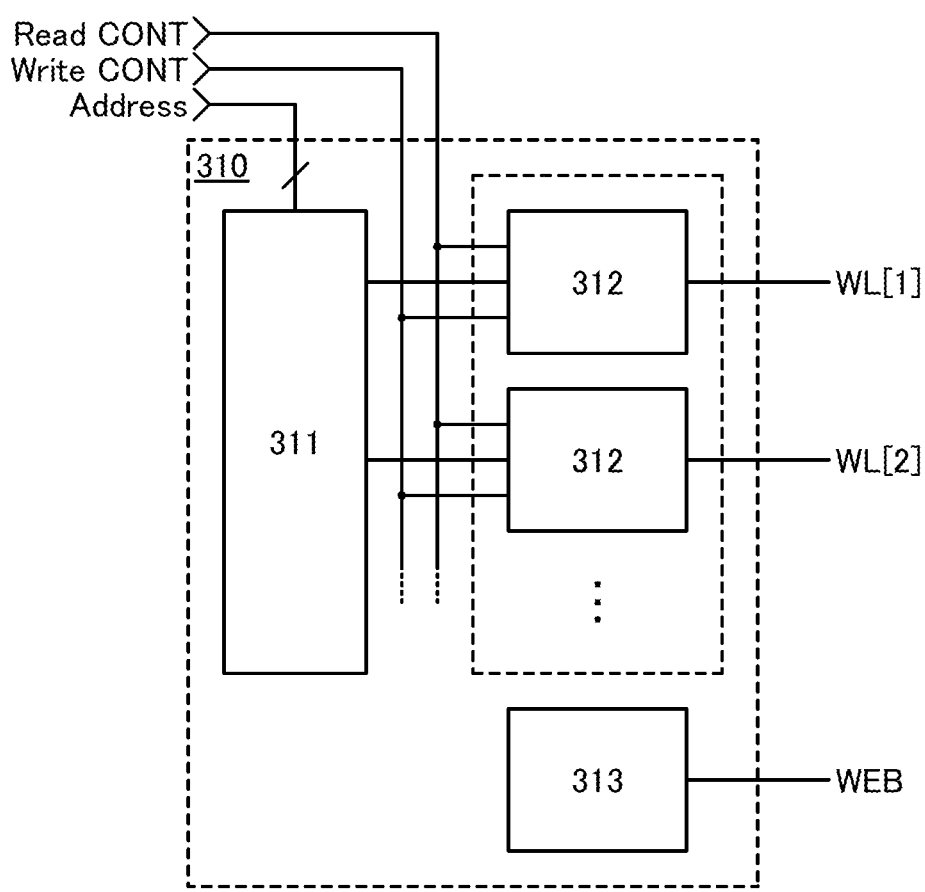
FIG. 10 illustrates one embodiment of a driver circuit.

FIG. 10 is a block diagram illustrating a configuration example of the row selection driver 310 in FIG. 9.

The row selection driver 310 in FIG. 10 includes a decoder 311, control circuits 312, and a control circuit 313. The wiring WL in every row is provided with one control circuit 312, and each control circuit 312 is connected to one of the wirings WL[1] to WL[n].

The decoder 311 is a circuit having a function of outputting a signal for selecting a specific wiring WL. Specifically, the decoder 311 receives an address signal Address and selects the control circuit 312 in a predetermined row in accordance with the address signal Address. With the decoder 311, the row selection driver 310 can select a given row to write or read data. Note that the decoder 311 may have a function of selecting one of the control circuits 312 or may have a function of selecting two or more of the control circuits 312.

The control circuits 312 are circuits having a function of selectively outputting a selection signal to the wiring WL in a specific row selected by the decoder 311. Specifically, the control circuits 312 receive a write control signal Write_CONT and a read control signal Read_CONT and selectively output selection signals in accordance with these input signals. With the control circuits 312, the row selection driver 310 can selectively output the selection signal to the row selected by the decoder 311.

The control circuit 313 is a circuit having a function of supplying a signal for selecting the control circuit 30 to the wiring WEB. With the control circuit 313, the row selection driver 310 can control the timing of supplying a predetermined potential to the wiring BL.

[Configuration Example of Column Selection Driver]

Figure 11:
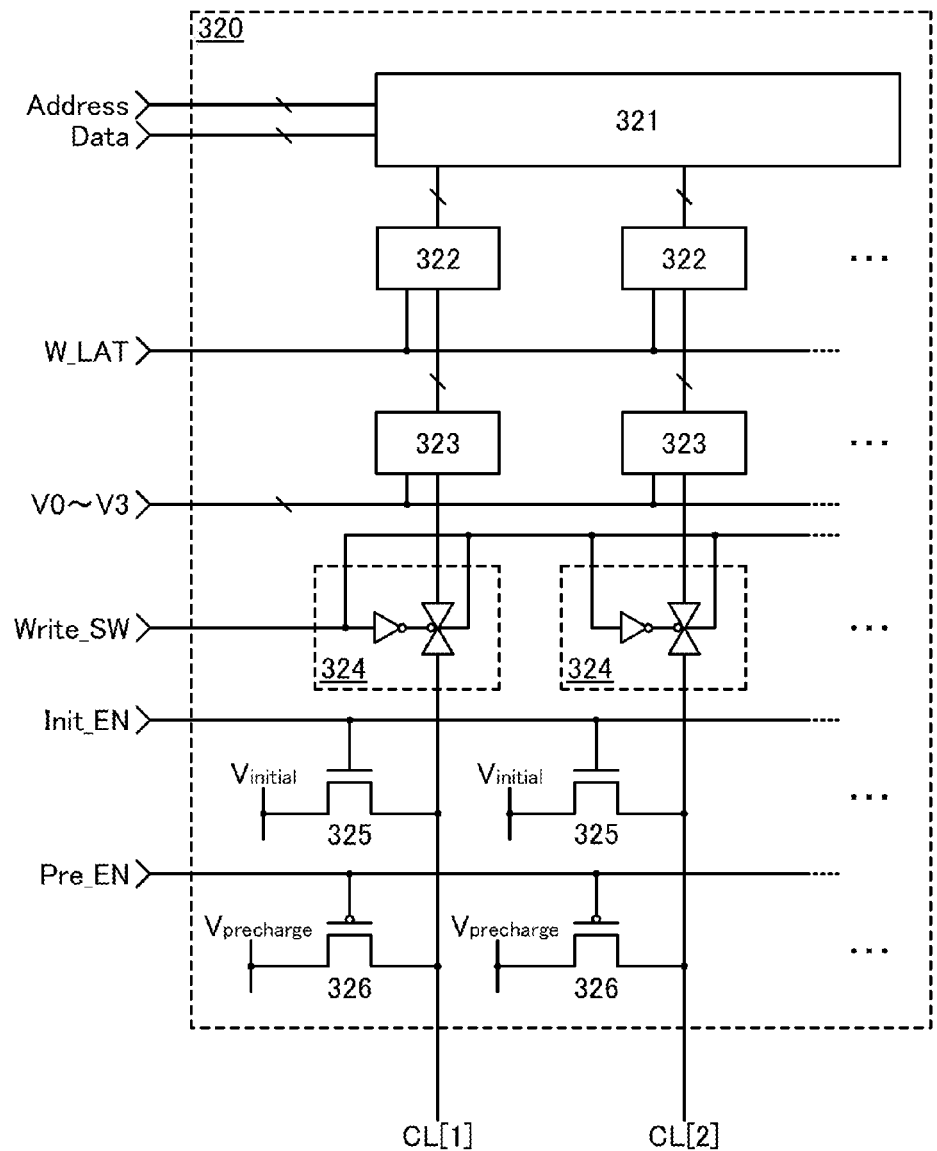
FIG. 11 illustrates one embodiment of a driver circuit.

FIG. 11 is a block diagram illustrating a configuration example of a mechanism which controls a signal to be supplied to the wiring CL in the column selection driver 320 illustrated in FIG. 9.

The column selection driver 320 illustrated in FIG. 11 includes a decoder 321, latch circuits 322, D/A converters 323, switch circuits 324, transistors 325, and transistors 326. Each column is provided with one latch circuit 322, one D/A converter 323, one switch circuit 324, one transistor 325, and one transistor 326. Furthermore, the switch circuit 324, the transistor 325, and the transistor 326 of each column are connected to the wiring CL.

The decoder 321 is a circuit having a function of selecting a column in which the wiring CL is provided and distributing input data to output the data. Specifically, the decoder 321 receives an address signal Address and data Data and outputs the data Data to the latch circuit 322 of any of columns in accordance with the address signal Address. The decoder 321 allows the column selection driver 320 to select a given column and write data.

Note that the data Data input to the decoder 321 is a-bit digital data. The a-bit digital data is a signal represented by binary data of '1' or '0' for each bit. For example, 2-bit digital data is data represented by '00', '01', '10', or '11'.

The latch circuit 322 has a function of temporarily storing the input data Data. Specifically, the latch circuit 322 is a flip-flop circuit that receives a latch signal W_LAT, stores the data Data, and outputs the data Data to the D/A converter 323 in accordance with the latch signal W_LAT. The latch circuit 322 enables the column selection driver 320 to write data at an opportune time.

The D/A converter 323 is a circuit having a function of converting input digital data Data into analog data $V_{data}$. For example, the D/A converter 323 converts 2-bit data Data into one of four potentials ($V_0$ to $V_3$) and outputs the potential to the switch circuit 324. The D/A converter 323 allows the column selection driver 320 to convert data to be written to the memory cell 21 into a potential corresponding to multi-level data.

Note that the data $V_{data}$ output from the D/A converter 323 can be represented by different voltage levels. For example, 2-bit data $V_{data}$ is represented by any of the four voltage levels (0.0 V, 0.4 V, 0.8 V, or 1.2 V).

The switch circuit 324 has a function of supplying input data $V_{data}$ to the wiring CL and a function of bringing the wiring CL into an electrically floating state. Specifically, the switch circuit 324 includes an analog switch and an inverter. The switch circuit 324 supplies the data $V_{data}$ to the wiring CL in accordance with a switch control signal Write_SW, and then makes the wiring CL electrically floating by turning off the analog switch. The switch circuit 324 enables the column selection driver 320 to keep the wiring CL in an electrically floating state after the data $V_{data}$ is supplied to the wiring CL.

The transistor 325 has a function of supplying an initialization voltage $V_{initial}$ to the wiring CL and a function of bringing the wiring CL into an electrically floating state. Specifically, the transistor 325 is a switch that supplies an initialization voltage $V_{initial}$ to the wiring CL in accordance with an initialization control signal Init_EN, and then brings the wiring CL into an electrically floating state. The transistor 325 enables the column selection driver 320 to keep the wiring CL in an electrically floating state after the initialization voltage $V_{initial}$ is supplied to the wiring CL. Note that the initialization voltage $V_{initial}$ can be used as, for example, a potential supplied to the wiring CL in the period T13 or the period T33 in FIG. 4.

The transistor 326 has a function of supplying a precharge voltage $V_{precharge}$ to the wiring CL and a function of bringing the wiring CL into a floating state. Specifically, the transistor 326 is a switch that supplies a precharge voltage $V_{precharge}$ to the wiring CL in accordance with a precharge control signal Pre_EN, and then brings the wiring CL into an electrically floating state. The transistor 326 enables the column selection driver 320 to keep the wiring CL in an electrically floating state after the precharge voltage $V_{precharge}$ is supplied to the wiring CL. Note that the transistor 326 can be omitted.

<Configuration Example of Computer>

Figure 12:
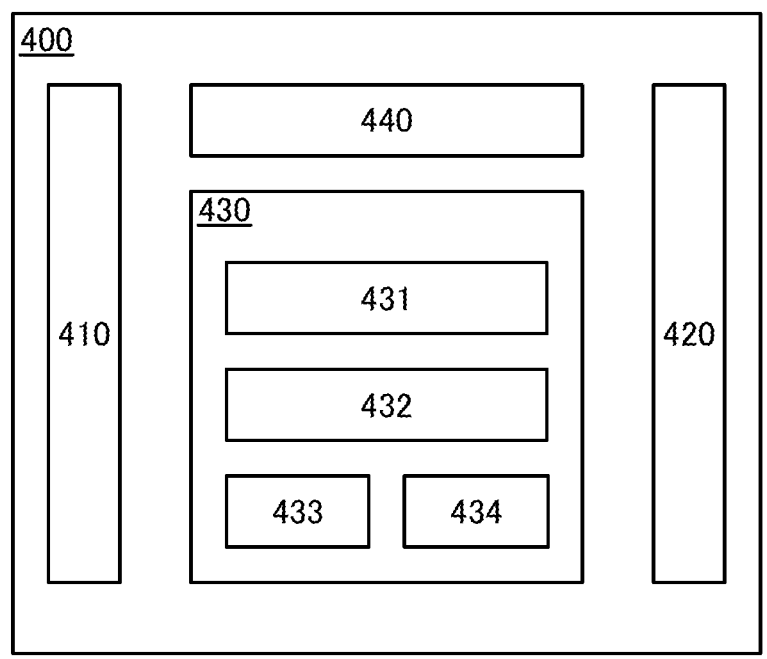
FIG. 12 illustrates one embodiment of a computer.

FIG. 12 is a block diagram illustrating a configuration example of a computer including the above-described memory device.

A computer 400 includes an input device 410, an output device 420, a central processing unit 430, and a main memory device 440.

The central processing unit 430 includes a control circuit 431, an arithmetic circuit 432, a memory device 433, and a memory device 434.

The input device 410 has a function of inputting data from the outside to the computer 400.

The output device 420 has a function of outputting data from the computer 400 to the outside.

The control circuit 431 has a function of outputting control signals to the input device 410, the output device 420, and the main memory device 440 for controlling these devices.

The arithmetic circuit 432 has a function of performing a calculation using input data.

The memory device 433 retains data used for calculations or the like by the arithmetic circuit 432. The memory device 433 has a function of a register.

The memory device 434 is used to store a copy of frequently used information of the main memory device 440. The memory device 434 has a function of a cache memory.

The memory device 434 can be accessed at a higher speed than the main memory device 440, which increases the processing speed of the central processing unit 430. Note that the main memory device has a larger capacity than the cache memory, and the cache memory has a larger capacity than the register. The cache memory and the register operate at a higher speed than the main memory device. The memory device 300 in FIG. 9 can be used as the memory device 433, the memory device 434, or the main memory device 440.

This embodiment can be combined with any of the other embodiments as appropriate.

Embodiment 4

Described in this embodiment are transistors of one embodiment of the disclosed invention.

Note that the transistors of one embodiment of the present invention preferably include a c-axis aligned crystalline oxide semiconductor (CAAC-OS) film or a nanocrystalline oxide semiconductor (nc-OS) film described in Embodiment 6.

<Structural Example 1 of Transistor>

FIGS. 13A to 13C are a top view and cross-sectional views of a transistor 1400a. FIG. 13A is a top view. FIG. 13B is a cross-sectional view taken along dashed-dotted line A1-A2 in FIG. 13A, and FIG. 13C is a cross-sectional view taken along dashed-dotted line A3-A4 in FIG. 13A. Note that for simplification of the drawing, some components are not illustrated in the top view in FIG. 13A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 in contact with top and side surfaces of the metal oxide 1432, a conductive film 1423 also in contact with the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 in contact with the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405, 1407, and 1408 serve as a protective insulating film or an interlayer insulating film of the transistor 1400a.

As illustrated in FIG. 13C, the side surface of the metal oxide 1432 is surrounded by the conductive film 1411. With this structure, the metal oxide 1432 can be electrically surrounded by an electric field of the conductive films 1411 and 1412. Such a structure of a transistor in which a semiconductor is electrically surrounded by an electric field of a gate electrode is referred to as a surrounded channel (s-channel) structure. Since a channel is formed in the entire metal oxide 1432 (bulk) in the s-channel structure, a large amount of current can flow between a source and a drain of a transistor, increasing the on-state current of the transistor.

The s-channel structure, because of its high on-state current, is suitable for a semiconductor device which requires a miniaturized transistor, such as a large-scale integrated (LSI) circuit. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As illustrated in FIG. 13B, the conductive films 1411 and 1422 have a region where they overlap with each other with the insulating film positioned therebetween. The conductive films 1411 and 1424 also have a region where they overlap with each other with the insulating film positioned therebetween. These regions serve as the parasitic capacitance caused between the gate electrode and the source or drain electrode and might decrease the operating speed of the transistor 1400a. This parasitic capacitance can be reduced by providing the insulating film 1405 in the transistor 1400a. The insulating film 1405 preferably contains a material with a low relative dielectric constant.

Figure 14A:
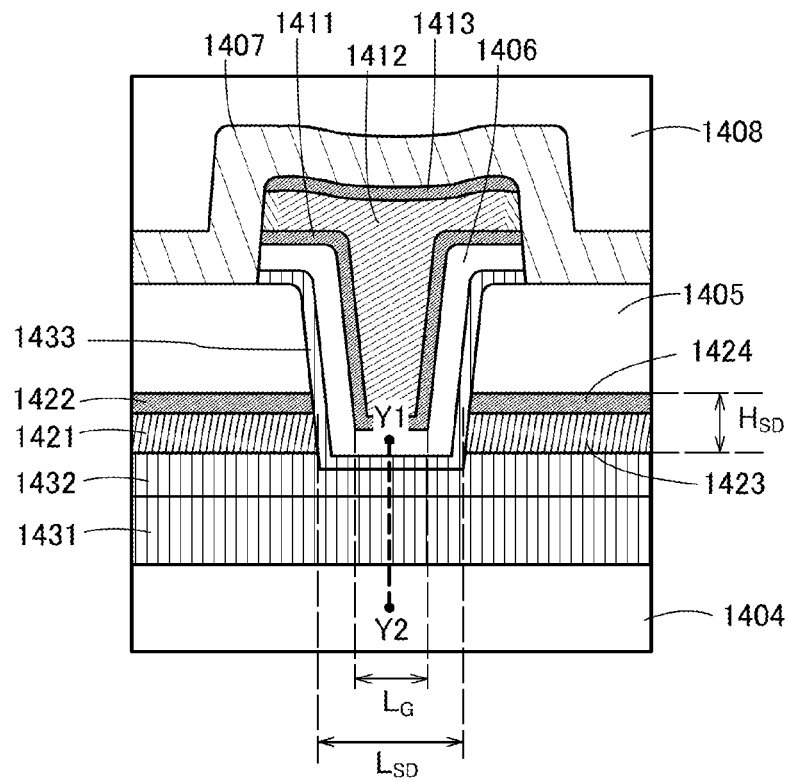
FIG. 14A is a cross-sectional view illustrating a structural example of a transistor.

FIG. 14A is an enlarged view of the center of the transistor 1400a. In FIG. 14A, a width $L_G$ denotes the length of the bottom surface of the conductive film 1411, which faces and lies parallel to the top surface of the metal oxide 1432 with the insulating film 1406 and the metal oxide 1433 positioned therebetween. The width $L_G$ is the line width of the gate electrode. In FIG. 14A, a width $L_{SD}$ denotes the length between the conductive films 1421 and 1423, i.e., the length between the source electrode and the drain electrode.

The width $L_{SD}$ is generally determined by the minimum feature size. As illustrated in FIG. 14A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 14A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three or more times, and further preferably five or more times the thickness of the insulating film 1406, in which case the parasitic capacitance is negligibly small. As a result, the transistor 1400a can operate at high frequencies.

Components of the transistor 1400a will be described below.

[Metal Oxide]

First, a metal oxide that can be used as the metal oxides 1431 to 1433 will be described.

In the transistor 1400a, it is preferable that current flowing between a source and a drain in an off state (off-state current) be low. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (A1), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 1432 is preferably a CAAC-OS film which is described later.

The metal oxides 1431 and 1433 include, for example, one or more, or two or more, elements other than oxygen included in the metal oxide 1432. Since the metal oxides 1431 and 1433 include one or more, or two or more, elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with the above composition is preferably used. For example, In:M:Zn is preferably 1:3:2 or 1:3:4.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 14B:
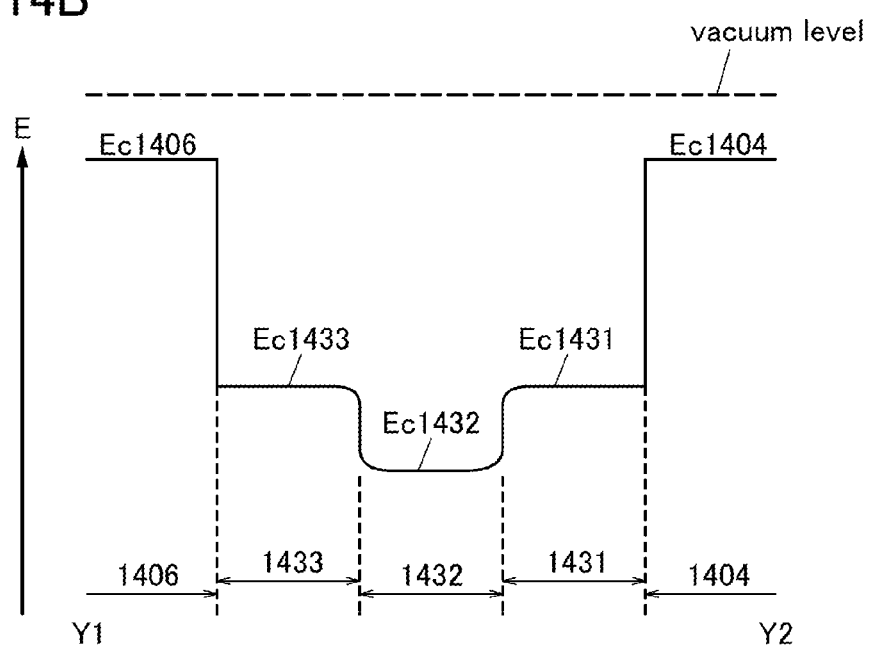
FIG. 14B is an energy band diagram of the transistor.

The function and effect of the metal oxide 1430, which includes a stack of the metal oxides 1431 to 1433, are described with reference to the energy band diagram of FIG. 14B. FIG. 14B shows an energy band structure of a portion taken along dashed line Y1-Y2 in FIG. 14A, that is, the energy band structure of a channel formation region of the transistor 1400a and the vicinity thereof.

In FIG. 14B, Ec1404, Ec1431, Ec1432, Ec1433, and Ec1406 indicate the energies at the bottoms of the conduction bands of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having an electron affinity higher than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy difference between the vacuum level and the bottom of the conduction band.

An indium gallium oxide has a small electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 1432 having the highest electron affinity among the metal oxides 1431 to 1433.

At this time, electrons move mainly in the metal oxide 1432, not in the metal oxides 1431 and 1433. Hence, the on-state current of the transistor hardly varies even when the density of interface states, which inhibit electron movement, is high at the interface between the metal oxide 1431 and the insulating film 1404 or at the interface between the metal oxide 1433 and the insulating film 1406. The metal oxides 1431 and 1433 function as an insulating film.

In some cases, there is a mixed region of the metal oxides 1431 and 1432 between the metal oxides 1431 and 1432. In some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical surface unevenness in a channel formation region is large. To increase the on-state current of the transistor, for example, the root mean square (RMS) roughness in a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (Ra) in the measurement area of 1 μm×1 μm is less than 1 nm, preferably less than 0.6 nm, more preferably less than 0.5 nm, still more preferably less than 0.4 nm. The maximum peak-to-valley height (P-V) in the measurement area of 1 μm×1 μm is less than 10 nm, preferably less than 9 nm, more preferably less than 8 nm, still more preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having oxygen permeability (a layer through which oxygen can pass or permeate).

Note that in the case where the transistor has an s-channel structure, a channel is formed in the entire metal oxide 1432. Therefore, as the metal oxide 1432 has a larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm and further preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/ cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without the metal oxide 1431 or 1433 may be employed. Alternatively, the metal oxide given as an example of the metal oxides 1431 to 1433 may be provided over or under the metal oxide 1431 or over or under the metal oxide 1433, i.e., a four-layer structure may be employed. Further alternatively, an n-layer structure (n is an integer of 5 or more) in which the metal oxide given as an example of the metal oxides 1431 to 1433 is provided at two or more of the following positions may be employed: over the metal oxide 1431, under the metal oxide 1431, over the metal oxide 1433, and under the metal oxide 1433.

[Substrate]

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, a metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

[Base Insulating Film]

The insulating film 1401 has a function of electrically isolating the substrate 1450 from the conductive film 1414.

The insulating film 1401 or 1402 is formed using an insulating film having a single-layer structure or a layered structure. Examples of the material of the insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, an oxynitride refers to a compound that contains more oxygen than nitrogen, and a nitride oxide refers to a compound that contains more nitrogen than oxygen.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen more than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

[Gate Electrode]

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

[Source Electrode and Drain Electrode]

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

[Low-Resistance Region]

The regions 1441 and 1442 are formed when, for example, the conductive films 1421 and 1423 extract oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier density in the regions 1441 and 1442. As a result, the resistance of the regions 1441 and 1442 is reduced.

[Gate Insulating Film]

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, a combination of silicon oxide or silicon oxynitride with an insulator with a high relative dielectric constant allows the layered structure to be thermally stable and have a high relative dielectric constant. For example, when aluminum oxide, gallium oxide, or hafnium oxide is on the metal oxide 1433 side, entry of silicon from silicon oxide or silicon oxynitride into the metal oxide 1432 can be suppressed.

When silicon oxide or silicon oxynitride is on the metal oxide 1433 side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

[Interlayer Insulating Film and Protective Insulating Film]

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing permeation of both oxygen and impurities such as hydrogen and moisture.

When the insulating film 1407 is formed using plasma containing oxygen by a sputtering method, a CVD method, or the like, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused through the insulating films to reach the metal oxide 1430, whereby oxygen vacancies in the metal oxide 1430 can be reduced.

Figure 15A:
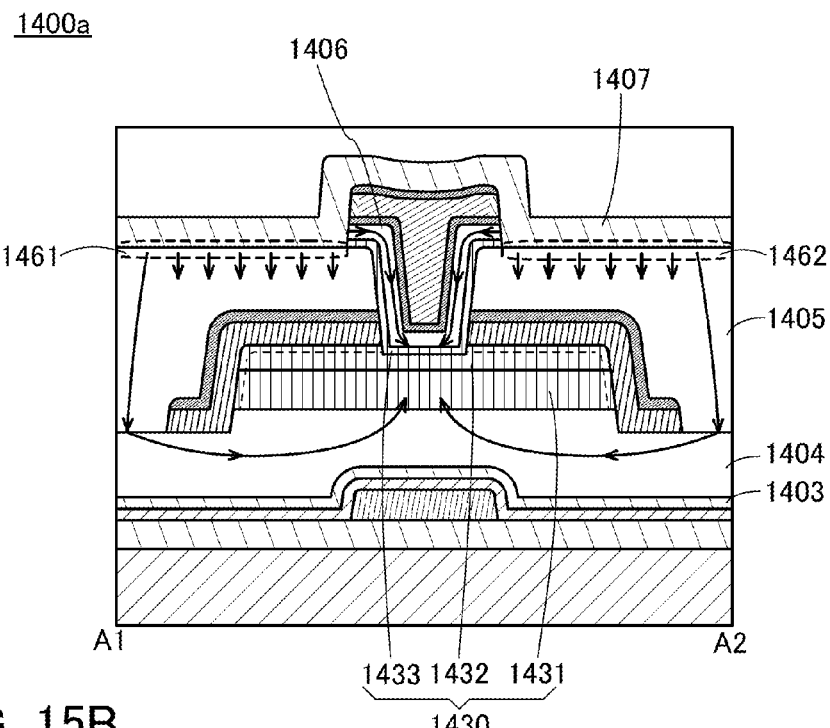
FIGS. 15A and 15B are cross-sectional views illustrating oxygen diffusion paths.
Figure 15B:
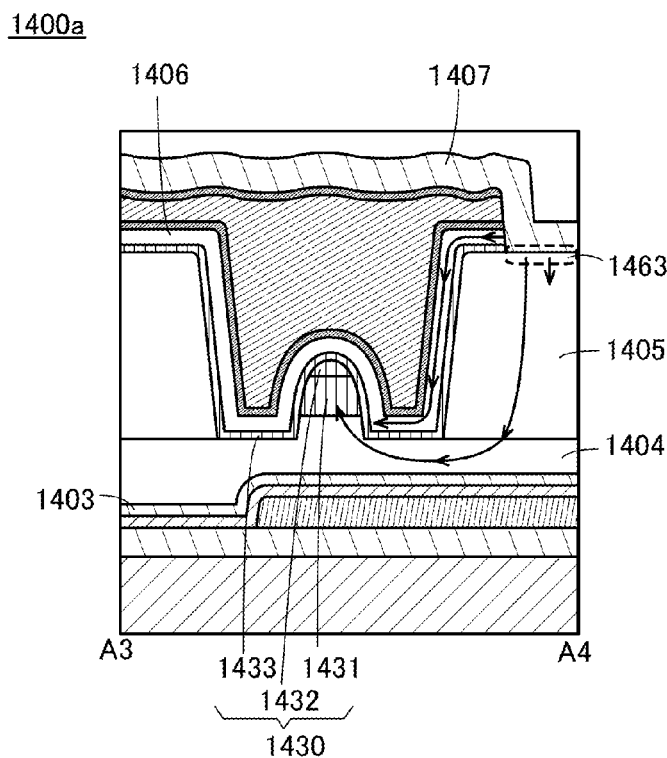

In schematic views of FIGS. 15A and 15B, oxygen added to the insulating films 1405 and 1406 in the formation of the insulating film 1407 is diffused through the insulating films by the second heat treatment and reaches the metal oxide 1430. In FIG. 15A, oxygen diffusion in the cross-sectional view of FIG. 13B is indicated by arrows. In FIG. 15B, oxygen diffusion in the cross-sectional view of FIG. 13C is indicated by arrows.

As illustrated in FIGS. 15A and 15B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused upward across the insulating film 1407. The insulating film 1403 also has a function of blocking oxygen and prevents oxygen from being diffused downward across the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below by the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Structural Example 2 of Transistor>

The conductive film 1414 and the insulating films 1402 and 1403 can be omitted in the transistor 1400*a* illustrated in FIGS. 13A to 13C. An example of such a structure is illustrated in FIGS. 16A to 16C.

Figure 16A:
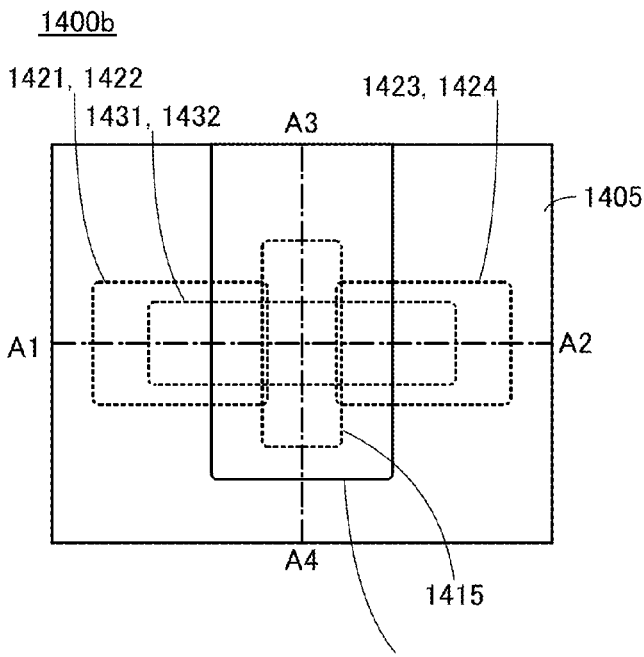
FIGS. 16A to 16C are a top view and cross-sectional views illustrating a structural example of a transistor.
Figure 16B:
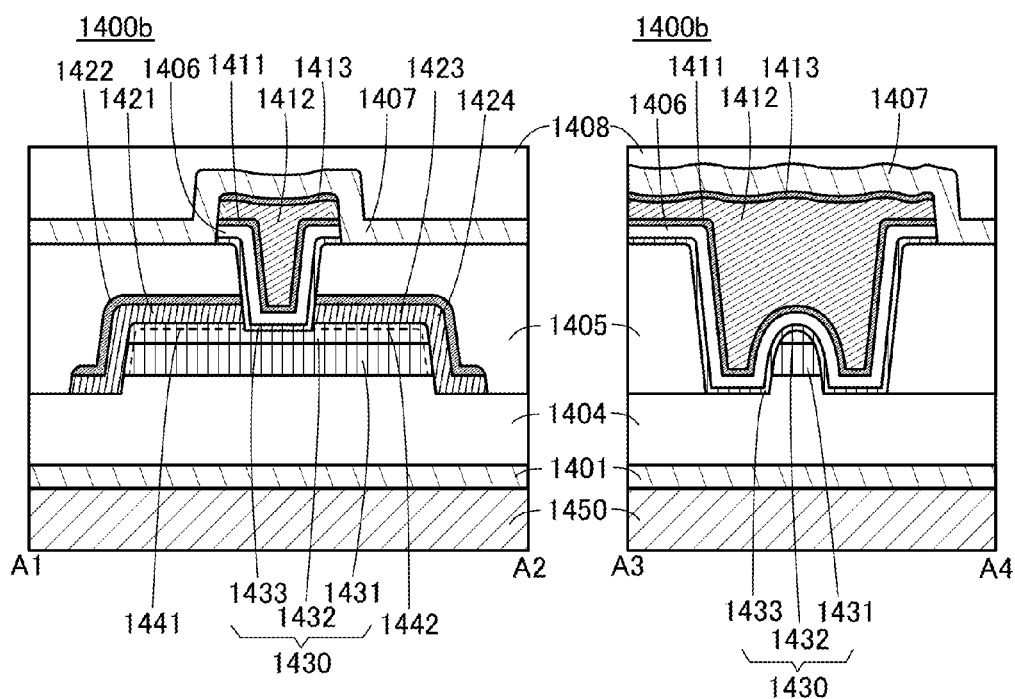
Figure 16C:
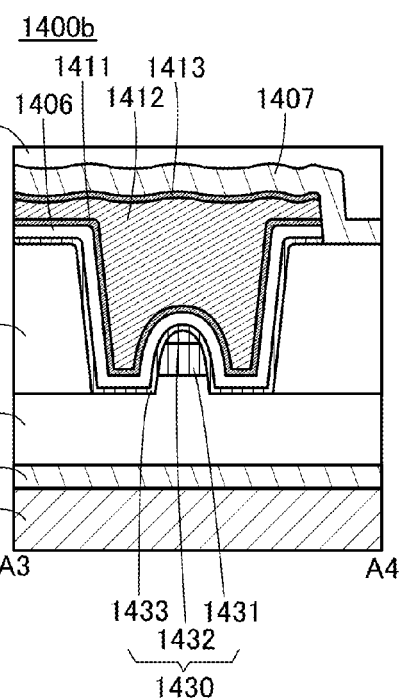

FIGS. 16A to 16C are a top view and cross-sectional views of a transistor 1400*b*. FIG. 16A is a top view. FIG. 16B is a cross-sectional view taken along dashed-dotted line A1-A2 in FIG. 16A, and FIG. 16C is a cross-sectional view taken along dashed-dotted line A3-A4 in FIG. 16A. Note that for simplification of the drawing, some components are not illustrated in the top view in FIG. 16A. Note that the dashed-dotted line A1-A2 and the dashed-dotted line A3-A4 are sometimes referred to as a channel length direction of the transistor 1400*b* and a channel width direction of the transistor 1400*b*, respectively.

In the transistor 1400*a* illustrated in FIGS. 13A to 13C, parts of the conductive films 1421 and 1423 that overlap with the gate electrode (the conductive films 1411 to 1413) can be reduced in thickness. An example of such a structure is illustrated in FIGS. 17A to 17C.

Figure 17A:
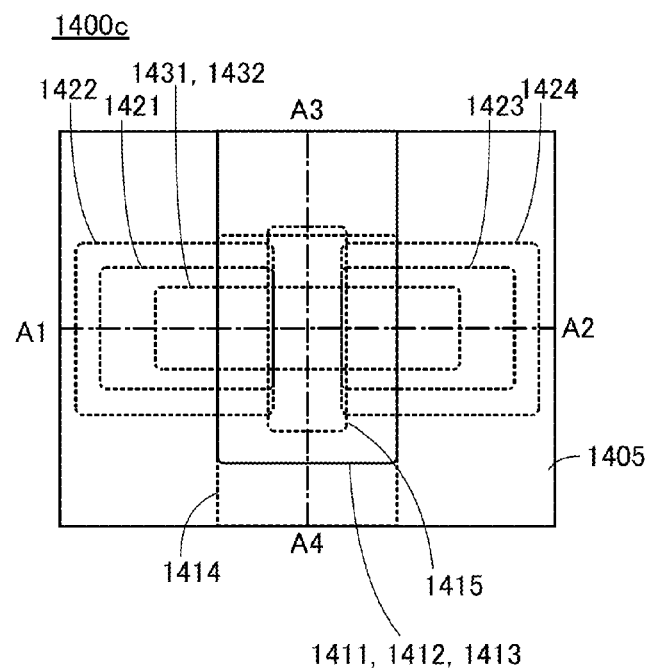
FIGS. 17A to 17C are a top view and cross-sectional views illustrating a structural example of a transistor.
Figure 17B:
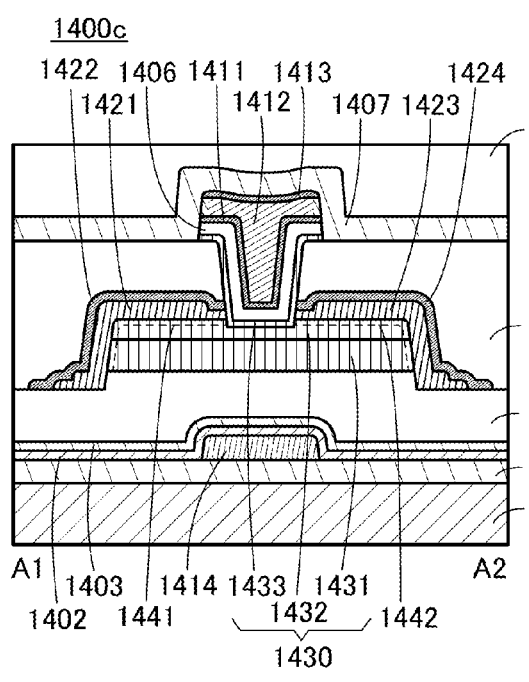
Figure 17C:
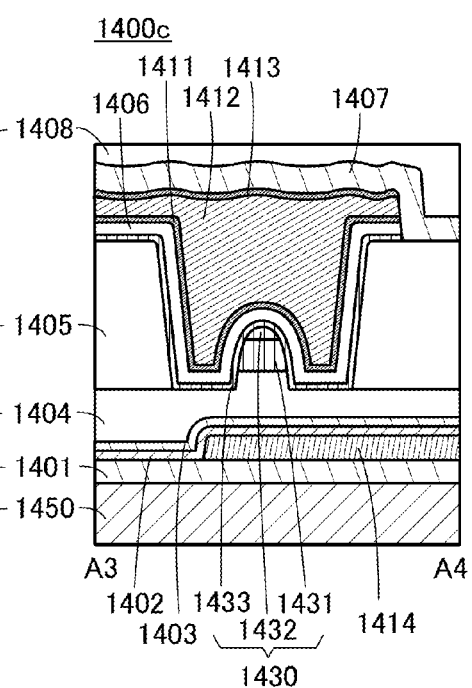

FIGS. 17A to 17C are a top view and cross-sectional views of a transistor 1400*c*. FIG. 17A is a top view. FIG. 17B is a cross-sectional view taken along dashed-dotted line A1-A2 in FIG. 17A, and FIG. 17C is a cross-sectional view taken along dashed-dotted line A3-A4 in FIG. 17A. Note that for simplification of the drawing, some components are not illustrated in the top view in FIG. 17A. Note that the dashed-dotted line A1-A2 and the dashed-dotted line A3-A4 are sometimes referred to as a channel length direction of the transistor 1400*c* and a channel width direction of the transistor 1400*c*, respectively.

In the transistor 1400*c* illustrated in FIG. 17B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400*c*, which has the structure illustrated in FIG. 17B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structural Example 3 of Transistor>

In the transistor 1400*c* illustrated in FIGS. 17A to 17C, the width of the metal oxides 1431 and 1432 can be increased in the A3-A4 direction. An example of such a structure is illustrated in FIGS. 18A to 18C.

Figure 18A:
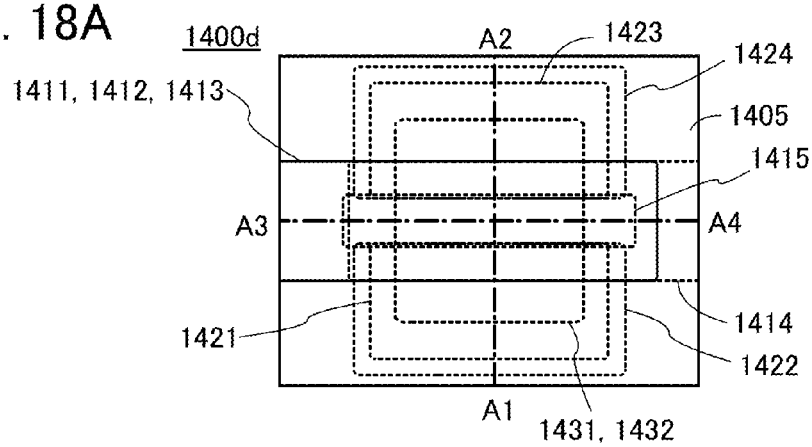
FIGS. 18A to 18C are a top view and cross-sectional views illustrating a structural example of a transistor.
Figure 18B:
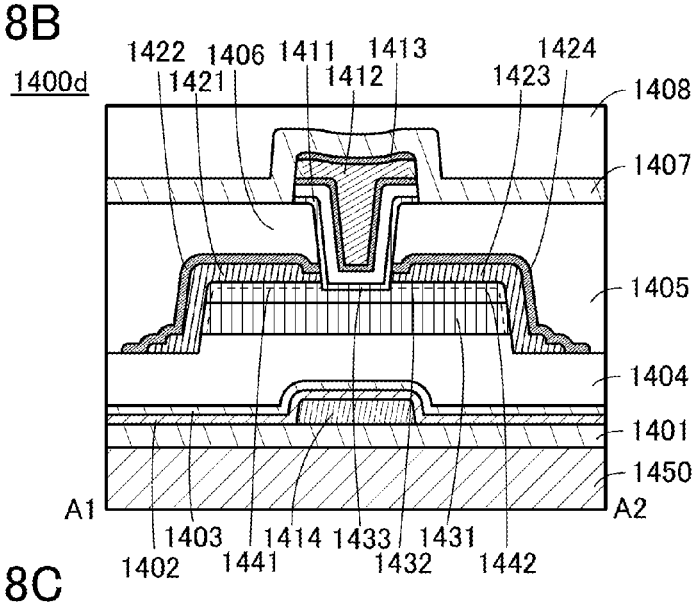
Figure 18C:
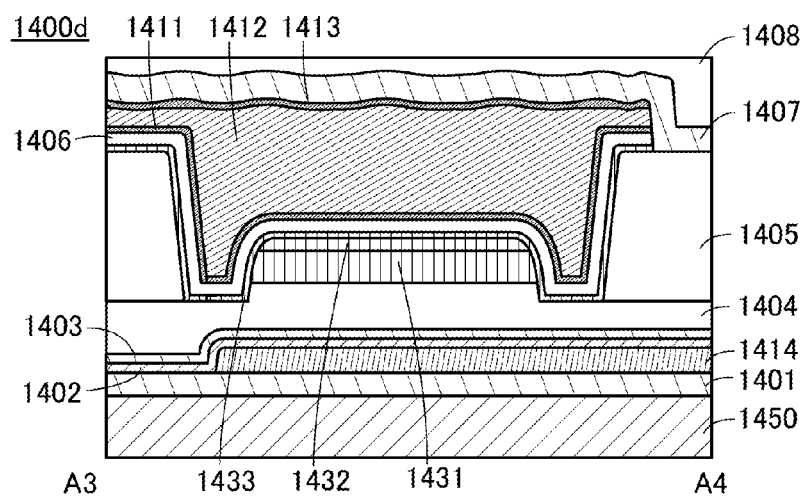

FIGS. 18A to 18C are a top view and cross-sectional views of a transistor 1400*d*. FIG. 18A is a top view. FIG. 18B is a cross-sectional view taken along dashed-dotted line A1-A2 in FIG. 18A, and FIG. 18C is a cross-sectional view taken along dashed-dotted line A3-A4 in FIG. 18A. Note that for simplification of the drawing, some components are not illustrated in the top view in FIG. 18A. Note that the dashed-dotted line A1-A2 and the dashed-dotted line A3-A4 are sometimes referred to as a channel length direction of the transistor 1400*d* and a channel width direction of the transistor 1400*d*, respectively.

The transistor 1400*d*, which has the structure illustrated in FIGS. 18A to 18C, can have an increased on-state current.

<Structural Example 4 of Transistor>

In the transistor 1400*c* illustrated in FIGS. 17A to 17C, a plurality of regions (hereinafter referred to as fins) consisting of the metal oxides 1431 and 1432 may be provided in the A3-A4 direction. An example of such a structure is illustrated in FIGS. 19A to 19C.

Figure 19A:
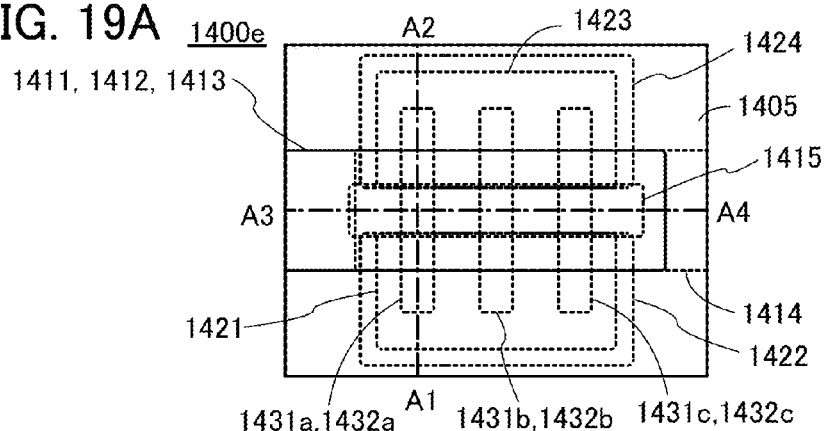
FIGS. 19A to 19C are a top view and cross-sectional views illustrating a structural example of a transistor.
Figure 19B:
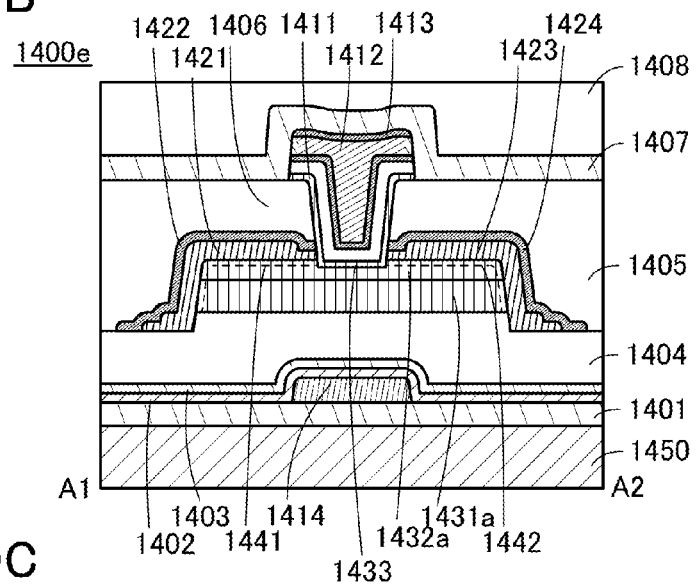
Figure 19C:
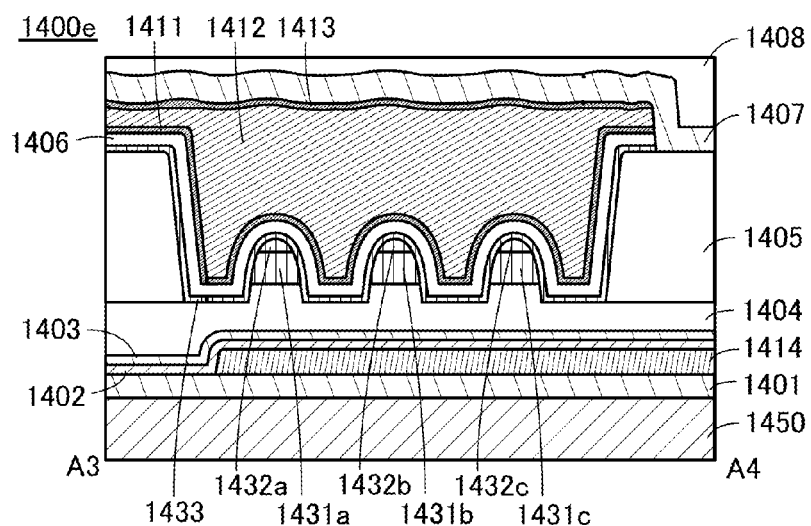

FIGS. 19A to 19C are a top view and cross-sectional views of a transistor 1400*e*. FIG. 19A is a top view. FIG. 19B is a cross-sectional view taken along dashed-dotted line A1-A2 in FIG. 19A, and FIG. 19C is a cross-sectional view taken along dashed-dotted line A3-A4 in FIG. 19A. Note that for simplification of the drawing, some components are not illustrated in the top view in FIG. 19A. Note that the dashed-dotted line A1-A2 and the dashed-dotted line A3-A4 are sometimes referred to as a channel length direction of the transistor 1400*e* and a channel width direction of the transistor 1400*e*, respectively.

The transistor 1400*e* includes a first fin consisting of metal oxides 1431*a* and 1432*a*, a second fin consisting of metal oxides 1431*b* and 1432*b*, and a third fin consisting of metal oxides 1431*c* and 1432*c*.

In the transistor 1400*e*, the metal oxides 1432*a* to 1432*c* where a channel is formed are surrounded by the gate electrode. Hence, a gate electric field can be applied to the entire channel, so that a transistor with a high on-state current can be obtained.

<Structural Example 5 of Transistor>

FIGS. 20A to 20D are a top view and cross-sectional views of a transistor 1400*f*. FIG. 20A is a top view of the transistor 1400*f*. FIG. 20B is a cross-sectional view taken along dashed-dotted line A1-A2 in FIG. 20A, and FIG. 20C is a cross-sectional view taken along dashed-dotted line A3-A4 in FIG. 20A. Note that the dashed-dotted line A1-A2 and the dashed-dotted line A3-A4 are sometimes referred to as a channel length direction and a channel width direction, respectively. The transistor 1400*f* has the s-channel structure like the transistor 1400*a* and the like. In the transistor 1400*f*, an insulating film 1409 is provided in contact with the side surface of the conductive film 1412 used as a gate electrode. The insulating film 1409 and the conductive film 1412 are covered with the insulating film 1407. The insulating film 1409 serves as a sidewall insulator of the transistor 1400*f*. As in the transistor 1400*a*, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, the conductive film 1412 serves as a gate electrode of the transistor 1400f, and the insulating film 1409 serves as a sidewall insulating film of the transistor 1400f.

The metal oxide 1432 has a region where it overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this example is not limited to the one in which the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

FIG. 20D is an enlarged view of part of FIG. 20B. As illustrated in FIG. 20D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Instead of the term "dopant," the term "donor," "acceptor," "impurity," or "element" may be used.

As illustrated in FIG. 20D, the region 1461a is a region substantially overlapping with the conductive film 1412, and the region 1461b, the region 1461c, the region 1461d, and the region 1461e are regions except the region 1461a in the metal oxide 1430. In the regions 1461b and 1461c, the top surface of the metal oxide 1433 is in contact with the insulating film 1407. In the regions 1461d and 1461e, the top surface of the metal oxide 1433 is in contact with the insulating film 1409 or the insulating film 1406. Thus, as illustrated in FIG. 20D, the boundary between the region 1461b and the region 1461d overlaps with the boundary between the insulating film 1407 and the side edge of the insulating film 1409. The same applies to the boundary between the regions 1461c and 1461e. It is preferable that the region 1461d and the region 1461e partly overlap with a region (channel formation region) in which the metal oxide 1432 overlaps with the conductive film 1412. For example, the side edges of the region 1461d and the region 1461e in the channel length direction are preferably positioned inward from the side edge of the conductive film 1412 by a distance d. In that case, the thickness $t_{406}$ of the insulating film 1406 and the distance d preferably satisfy $0.25t_{406} < d < t_{406}$.

As described above, the region 1461d and the region 1461e are partly formed in a region in which the metal oxide 1430 overlaps with the conductive film 1412. Accordingly, the channel formation region of the transistor 1400f is in contact with the regions 1461d and 1461e having low resistance, and thus, high-resistance offset regions are not formed between the region 1461a and the regions 1461d and 1461e. As a result, the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conductive.

The region 1461b, the region 1461c, the region 1461d, and the region 1461e are formed by ion doping treatment such as an ion implantation method. Therefore, as illustrated in FIG. 20D, the positions of the side edges of the regions 1461d and 1461e in the channel length direction are sometimes shifted to the side edge of the metal oxide 1430 in the channel length direction in a deeper area from the top surface of the metal oxide 1433. The distance d in that case is the distance between the side edge of the conductive film 1412 in the channel length direction and each of the side edges of the regions 1461d and 1461e that are closest to the inner part of the conductive film 1412.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. It is preferable that the low-resistance region 1451 and the low-resistance region 1452 be partly and substantially in contact with a region (channel formation region) of the metal oxide 1432 overlapping with the conductive film 1412 or partly overlap with the region.

Since a large region of the metal oxide 1433 is in contact with the insulating film 1407, the low-resistance region 1451 and the low-resistance region 1452 are likely to be formed in the metal oxide 1433. The concentration of the element contained in the insulating film 1407 is higher in the low-resistance region 1451 and the low-resistance region 1452 included in the metal oxide 1433 than in a region of the metal oxide 1433 other than the low-resistance region 1451 and the low-resistance region 1452 (e.g., a region of the metal oxide 1433 overlapping with the conductive film 1412).

The low-resistance region 1451 is formed in the region 1461b, and the low-resistance region 1452 is formed in the region 1461c. Ideally, the metal oxide 1430 has a structure in which the concentration of an added element is the highest in the low-resistance regions 1451 and 1452, the second highest in the regions 1461b and 1461c to 1461e other than the low-resistance regions 1451 and 1452, and the lowest in the region 1461a. The added element refers to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 are not necessarily formed in the case where the regions 1461b and 1461c have a sufficiently low resistance.

<Structural Example 6 of Transistor>

Figure 21A:
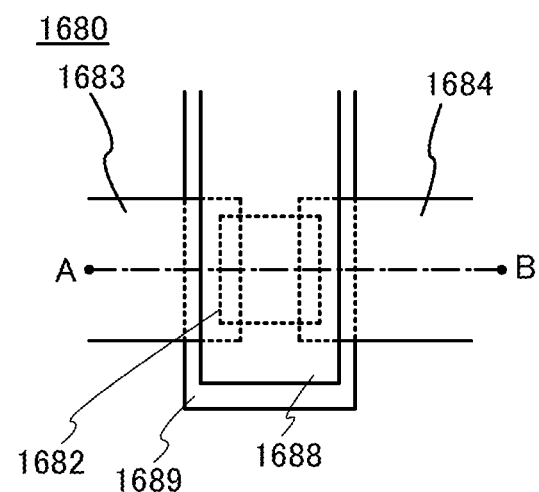
FIGS. 21A and 21B are a top view and a cross-sectional view illustrating a structural example of a transistor.
Figure 21B:
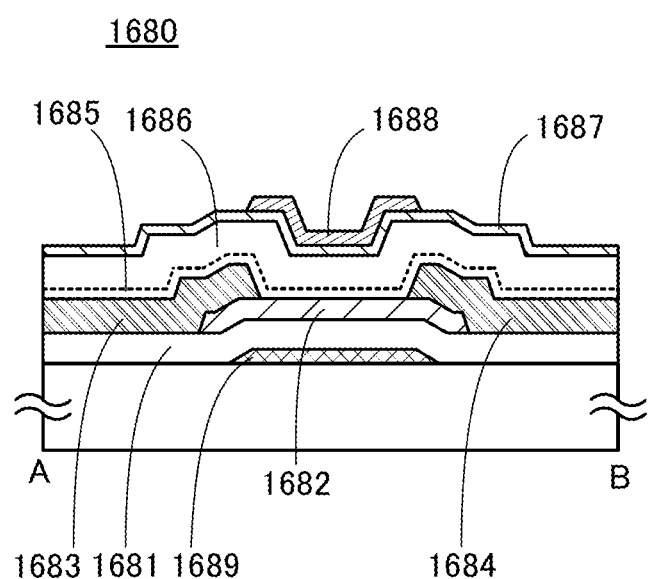

FIGS. 21A and 21B are a top view and a cross-sectional view of a transistor 1680. FIG. 21A is a top view, and FIG. 21B is a cross-sectional view taken along dashed-dotted line A-B in FIG. 21A. Note that for simplification of the drawings, some components are increased or reduced in size, or omitted in FIGS. 21A and 21B. Note that the direction of the dashed-dotted line A-B is sometimes referred to as a channel length direction.

The transistor 1680 illustrated in FIG. 21B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 13A to 13C can be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of threshold voltage. Note that the conductive film 1688 is unnecessary in some cases.

The description of the metal oxide 1432 in FIGS. 13A to 13C can be referred to for the details of the semiconductor 1682. The semiconductor 1682 may be a single layer or a stack including a plurality of semiconductor layers.

The description of the conductive films 1421 to 1424 in FIGS. 13A to 13C can be referred to for the details of the conductive films 1683 and 1684.

The description of the insulating film 1406 in FIGS. 13A to 13C can be referred to for the details of the insulating film 1681.

The insulating films 1685 to 1687 are sequentially stacked over the semiconductor 1682 and the conductive films 1683 and 1684 in FIG. 21B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the provision of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as illustrated in FIG. 21B. The insulating film 1685 preferably allows oxygen to pass therethrough, and causes little damage to the semiconductor 1682 when the insulating film 1685 is formed compared with the case of the insulating film 1686. If damage to the semiconductor 1682 can be reduced and the insulating film 1686 can be formed directly on the semiconductor 1682, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has a blocking effect of preventing diffusion of oxygen, hydrogen, and water. Alternatively, the insulating film 1687 preferably has a blocking effect of preventing diffusion of hydrogen and water.

As an insulating film has higher density and becomes denser or has a fewer dangling bonds and becomes more chemically stable, the insulating film has a more excellent blocking effect. An insulating film that has a blocking effect of preventing diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has a blocking effect of preventing diffusion of hydrogen and water can be formed using, for example, silicon nitride or silicon nitride oxide.

In the case where the insulating film 1687 has a blocking effect of preventing diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has a blocking effect of preventing diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

This embodiment can be combined with any of the other embodiments as appropriate.

Embodiment 5

In this embodiment, configuration examples of a device that can be applied to the semiconductor device 10 described in the above embodiment will be described with reference to FIGS. 22A and 22B, FIGS. 23A and 23B, FIGS. 24A and 24B, and FIGS. 25A and 25B.

<Cross-Sectional View 1>

FIGS. 22A and 22B are partial cross-sectional views of the semiconductor device 10. FIG. 22A illustrates a cross section in a channel length direction of the transistor included in the memory cell 21 of the semiconductor device 10. FIG. 22B illustrates a cross section in a channel width direction of the transistor included in the memory cell 21 of the semiconductor device 10.

The semiconductor device 10 illustrated in FIGS. 22A and 22B includes layers L1, L2, L3, L4, L5, L6, L7, L8, L9, L10, L11, and L12 in order from the bottom.

The layer L1 includes a substrate 1700, a transistor TrA formed using the substrate 1700, an element isolation layer 1701, and a plurality of conductors such as a conductor 1710 and a conductor 1711.

The layer L2 includes a plurality of wirings such as a wiring 1730 and a wiring 1731.

The layer L3 includes a plurality of conductors such as a conductor 1712 and a conductor 1713 and a plurality of wirings (not illustrated).

The layer L4 includes an insulator 1706, a transistor TrB, an insulator 1702, an insulator 1703, and a plurality of conductors such as a conductor 1714 and a conductor 1715.

The layer L5 includes a plurality of wirings such as a wiring 1732 and a wiring 1733.

The layer L6 includes a plurality of conductors such as a conductor 1716.

The layer L7 includes a transistor TrC, an insulator 1704, an insulator 1705, and a plurality of conductors such as a conductor 1717.

The layer L8 includes a plurality of wirings such as a wiring 1734 and a wiring 1735.

The layer L9 includes a plurality of conductors such as a conductor 1718 and a plurality of wirings (not illustrated).

The layer L10 includes a plurality of wirings such as a wiring 1736.

The layer L11 includes a capacitor C1 and a plurality of conductors such as a conductor 1719. The capacitor C1 includes a first electrode 1751, a second electrode 1752, and an insulator 1753.

The layer L12 includes a plurality of wirings such as a wiring 1737.

The OS transistor described in Embodiment 4 is preferably used as the transistors TrB and TrC. In FIGS. 22A and 22B, the transistor 1400c illustrated in FIGS. 17A to 17C is used as the transistors TrB and TrC.

The transistor TrA is preferably formed using a semiconductor material different from that for the transistors TrB and TrC. In FIGS. 22A and 22B, a Si transistor is used as the transistor TrA.

The control circuit 30 and the read circuit 40 are preferably in the layer L1 and the layer L2. The cell array 20 is preferably in the layers L4 to L11. Note that the capacitor 102 included in the memory cell 21 may be provided in the layer L11, not in the layers L1 and L2. In the case where the transistor 110 of the circuit 31 and the transistor 120 of the circuit 41 are OS transistors, these OS transistors may be provided in the layers L4 to L7.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 1700. Alternatively, a semiconductor element may be formed using one substrate, and then transferred to another substrate. In FIGS. 22A and 22B, as an example, a single crystal silicon wafer is used as the substrate 1700.

Figure 24A:
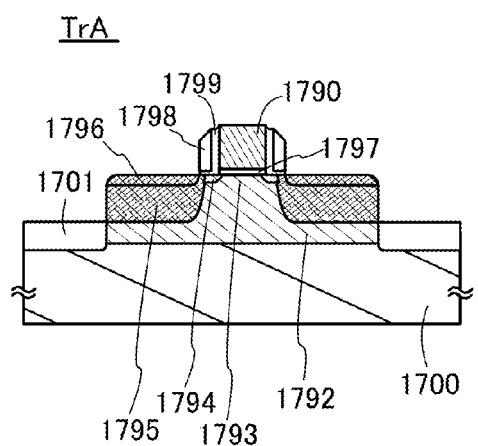
FIGS. 24A and 24B are cross-sectional views illustrating a structural example of a transistor.
Figure 24B:
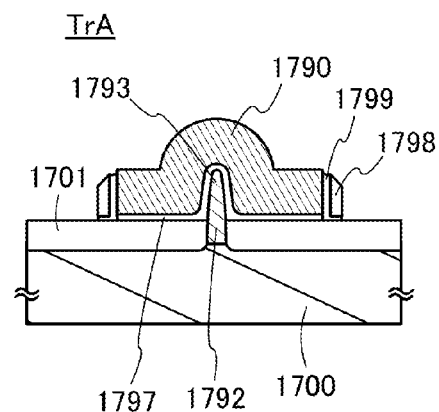

The transistor TrA is described in detail with reference to FIGS. 24A and 24B. FIG. 24A is a cross-sectional view of the transistor TrA in the channel length direction, and FIG. 24B is a cross-sectional view of the transistor TrA in the channel width direction. The transistor TrA includes a channel formation region 1793 formed in a well 1792, low-concentration impurity regions 1794 and high-concentration impurity regions 1795 (also collectively referred to as an impurity region simply), conductive regions 1796 provided in contact with the impurity region, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 1796 can be formed using metal silicide or the like.

In the transistor TrA in FIG. 24B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Note that the transistor TrA is not limited to the FIN-type transistor, and may be a planar-type transistor illustrated in FIGS. 25A and 25B. FIG. 25A is a cross-sectional view of the transistor TrA in the channel length direction, and FIG. 25B is a cross-sectional view of the transistor TrA in the channel width direction. The reference numerals in FIGS. 25A and 25B are the same as those shown in FIGS. 24A and 24B.

In FIGS. 22A and 22B, the insulators 1702 to 1706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors TrB and TrC. Examples of insulators having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

In FIGS. 22A and 22B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used.

In the case where an OS transistor is used as the transistor 101 shown in the above embodiment, the transistor 101 is preferably formed in the layer L4 or L7. In the case where memory cells 21 are stacked as illustrated in FIG. 8, the transistor 101 of one memory cell 21 may be formed in the layer L4 and the transistor 101 of another memory cell 21 may be formed in the layer L7.

In the case where a Si transistor is used as the transistor 110 or 120 shown in the above embodiment, the transistor is preferably formed in the layer L1.

In the case where an OS transistor is used as the transistor 110 or 120 shown in the above embodiment, the transistor is preferably formed in the layer L4 or L7.

The capacitor 102 shown in the above embodiment is preferably formed in the layer L11.

In the case where an OS transistor is used in a driver circuit in the periphery of the semiconductor device 10, the OS transistor may be formed in the layer L4 or L7.

In the case where a Si transistor is used in a driver circuit in the periphery of the semiconductor device 10, the Si transistor may be formed in the layer L1.

With the structure illustrated in FIGS. 22A and 22B, the area occupied by the semiconductor device 10 can be reduced, leading to a higher level of integration of the memory cells.

In the case where the semiconductor device 10 described in the above embodiment has the structure of FIGS. 22A and 22B, the numbers of the transistors (TrA, TrB, and TrC) and the capacitors (C1) are sometimes different from those shown in FIGS. 22A and 22B. In that case, the structure of FIGS. 22A and 22B can be changed as appropriate; for example, the numbers of the layers L4, L7, and L11 are increased or decreased, or an element is additionally provided in a layer.

<Cross-Sectional View 2>

All the OS transistors in the semiconductor device 10 may be formed in the same layer. An example of such a structure is illustrated in FIGS. 23A and 23B. Like FIGS. 22A and 22B, FIG. 23A illustrates a cross section in a channel length direction of the transistor included in the memory cell 21 of the semiconductor device 10, and FIG. 23B illustrates a cross section in a channel width direction of the transistor included in the memory cell 21 of the semiconductor device 10.

The cross-sectional views of FIGS. 23A and 23B are different from those of FIGS. 22A and 22B in that the layers L6 to L8 are omitted and the layer L9 is formed on the layer L5. For the other details in FIGS. 23A and 23B, the description of FIGS. 22A and 22B is referred to.

The transistor 101 shown in the above embodiment is preferably formed in the layer L4.

In the case where a Si transistor is used as the transistor 110 or 120 shown in the above embodiment, the transistor is preferably formed in the layer L1.

In the case where an OS transistor is used as the transistor 110 or 120 described in the above embodiment, the transistor is preferably formed in the layer L4.

The capacitor 102 shown in the above embodiment is preferably formed in the layer L11.

In the case where a driver circuit in the periphery of the semiconductor device 10 is formed using an OS transistor, the OS transistor may be formed in the layer L4.

In the case where a driver circuit in the periphery of the semiconductor device 10 is formed using a Si transistor, the Si transistor may be formed in the layer L1.

With the structure illustrated in FIGS. 23A and 23B, the production process of the semiconductor device 10 can be simplified.

In the case where the semiconductor device 10 described in the above embodiment has the structure of FIGS. 23A and 23B, the numbers of the transistors (TrA, TrB, and TrC) and the capacitors (C1) are sometimes different from those shown in FIGS. 23A and 23B. In that case, the structure of FIGS. 23A and 23B can be changed as appropriate; for example, the numbers of the layers L4 and L11 are increased or decreased, or an element is additionally provided in a layer.

This embodiment can be combined with any of the other embodiments as appropriate.

Embodiment 6

In this embodiment, the structure of an oxide semiconductor film that can be used for the OS transistor described in the above embodiment will be described.

An oxide semiconductor film is classified roughly into a non-single-crystal oxide semiconductor film and a single crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. In addition, the term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$. In this specification, trigonal and rhombohedral crystal systems are included in a hexagonal crystal system.

<CAAC-OS Film>

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, the surface where the CAAC-OS film is formed is also referred to as a formation surface) or a top surface of the CAAC-OS film, and is arranged parallel to the formation surface or the top surface of the CAAC-OS film.

On the other hand, according to the high-resolution planview TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is assigned to the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a highly purified intrinsic or substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in an OS transistor, variation in the electrical characteristics of the transistor due to irradiation with visible light or ultraviolet light is small.

Note that in this specification and the like, the expression "an oxide semiconductor is substantially highly purified intrinsic" refers to a state where an oxide semiconductor has a carrier density lower than $8\times10^{11}/cm^3$, preferably lower than $1\times10^{11}/cm^3$, and further preferably lower than $1\times10^{10}/cm^3$ and higher than or equal to $1\times10^{-9}/cm^3$. A transistor in which a highly purified intrinsic or substantially highly purified intrinsic oxide semiconductor is used for a channel formation region exhibits an extremely low off-state current. When a source-drain voltage is, for example, about 0.1 V, 5 V, or 10 V, the off-state current normalized by the channel width of the transistor can be as low as several yoctoamperes per micrometer to several zeptoamperes per micrometer.

<Microcrystalline Oxide Semiconductor Film>

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

<Amorphous Oxide Semiconductor Film>

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found. When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

The crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of a single crystal oxide semiconductor film having the same composition.

Specific examples of the above description are given. For example, in the case of an oxide semiconductor film having an atomic ratio of In:Ga:Zn=1:1:1, the density of a single crystal $InGaZnO_4$ film with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there might be no single crystal oxide semiconductor film having the same composition as the oxide semiconductor film. In that case, single crystal oxide semiconductor films with different compositions are combined at an adequate ratio, which makes it possible to calculate a density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

This embodiment can be combined with any of the other embodiments as appropriate.

Embodiment 7

In this embodiment, methods of forming the insulating layers, the conductive layers, the semiconductor layers, and the like included in the semiconductor device 10 described in the above embodiment will be described.

A sputtering method and a plasma CVD method are typical examples of a method of forming an insulating layer, a conductive layer, a semiconductor layer, and the like included in a semiconductor device. These layers can be formed by another method, for example, a thermal CVD method. A metal organic chemical vapor deposition (MOCVD) method or an atomic layer deposition (ALD) method can be employed as a thermal CVD method, for example.

A thermal CVD method has an advantage that no defect due to plasma damage is generated since it does not utilize plasma for forming a film. Deposition by a thermal CVD method may be performed in the following manner: the pressure in a chamber is set to an atmospheric pressure or a reduced pressure, and a source gas and an oxidizer are supplied to the chamber at the same time, react with each other in the vicinity of the substrate or over the substrate, and are deposited on the substrate.

Deposition by an ALD method may be performed in the following manner: the pressure in a chamber is set to an atmospheric pressure or a reduced pressure, source gases for reaction are sequentially introduced into the chamber, and then, the sequence of the gas introduction is repeated. For example, two or more kinds of source gases are sequentially supplied to the chamber by switching respective switching valves (also referred to as high-speed valves). In this case, a first source gas is introduced, an inert gas (e.g., argon or nitrogen) or the like is introduced at the same time as the first source gas or after the first source gas is introduced so that the source gases are not mixed, and then, a second source gas is introduced. In the case where the first source gas and the inert gas are introduced at the same time, the inert gas serves as a carrier gas, and the inert gas may also be introduced at the same time as the second source gas. Alternatively, the first source gas may be exhausted by vacuum evacuation instead of the introduction of the inert gas, and then, the second source gas may be introduced. The first source gas is adsorbed on the surface of the substrate to form a first single-atomic layer; then, the second source gas is introduced to react with the first single-atomic layer; as a result, a second single-atomic layer is stacked over the first single-atomic layer, so that a thin film is formed. The sequence of the gas introduction is repeated a plurality of times until a desired thickness is obtained, so that a thin film with excellent step coverage can be formed. The thickness of the thin film can be adjusted by the number of times the sequence of the gas introduction is repeated; therefore, an ALD method makes it possible to accurately adjust thickness and thus is suitable for manufacturing a minute FET.

The conductive films and the semiconductor films which are described in the above embodiments can be formed by a thermal CVD method such as an MOCVD method or an ALD method. For example, in the case where an InGaZnO$_X$ (X>0) film is formed, trimethylindium, trimethylgallium, and dimethylzinc can be used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium, and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced a plurality of times to form an initial tungsten film, and then, a $WF_6$ gas and an $H_2$ gas are used to form a tungsten film. Note that an $SiH_4$ gas may be used instead of a $B_2H_6$ gas.

For example, in the case where an oxide semiconductor film, e.g., an InGaZnO$_X$ (X>0) film is formed using a deposition apparatus employing ALD, an $In(CH_3)_3$ gas and an $O_3$ gas are sequentially introduced a plurality of times to form an $InO_2$ layer, a $Ga(CH_3)_3$ gas and an $O_3$ gas are used to form a GaO layer, and then, a $Zn(CH_3)_2$ gas and an $O_3$ gas are used to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments as appropriate.

Embodiment 8

In this embodiment, application examples of the semiconductor device or memory device described in the foregoing embodiment to an electronic component and to an electronic device including the electronic component will be described with reference to FIGS. 26A and 26B and FIGS. 27A to 27F.

<Electronic Component>

Figure 26A:
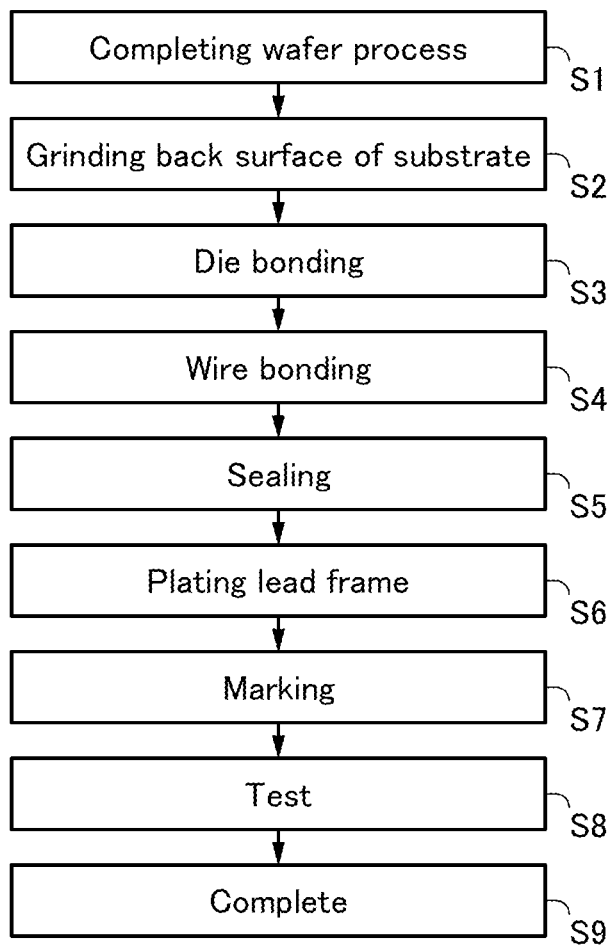
FIG. 26A is a flow chart illustrating an electronic component.

FIG. 26A shows an example where the semiconductor device described in the foregoing embodiment is used to make an electronic component. Note that an electronic component is also referred to as semiconductor package or IC package. This electronic component has various standards and names depending on the direction and the shape of terminals. Therefore, an example of the electronic component will be described in this embodiment.

A semiconductor device including the transistors in the foregoing embodiment is completed by integrating detachable components on a printed circuit board through an assembly process (post-process).

The post-process can be completed through steps shown in FIG. 26A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and separating the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, the chip may be mounted on and bonded to an interposer.

Note that in this embodiment, when an element is formed on one surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. For wire bonding, ball bonding or wedge bonding can be employed.

A molding step is performed to seal the wire-bonded chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

After being plated, the lead of the lead frame is cut and processed into a predetermined shape (Step S6). The plating process prevents rust of the lead and facilitates soldering at the time of mounting on a printed circuit board in a later step.

Printing (marking) is performed on the package surface (Step S7). After a final testing step (Step S8), the electronic component is completed (Step S9).

Since the electronic component described above includes the semiconductor device of the foregoing embodiment, it is possible to improve the reliability of the electronic component.

Figure 26B:
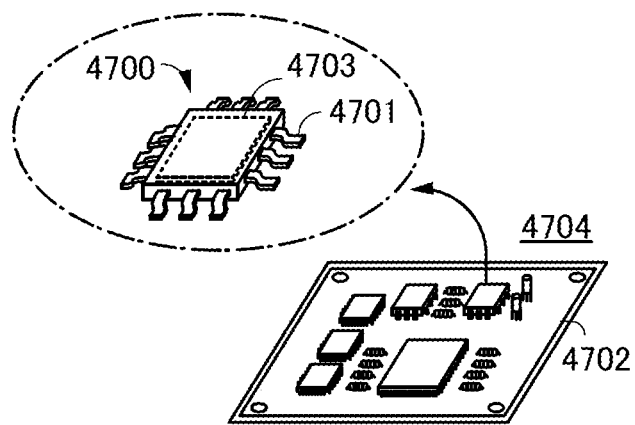
FIG. 26B is a perspective view of the electronic component.

FIG. 26B is a perspective schematic diagram of a completed electronic component. FIG. 26B shows a perspective schematic diagram of a quad flat package (QFP) as an example of the electronic component. An electronic component 4700 in FIG. 26B includes a lead 4701 and a circuit portion 4703. The electronic component 4700 in FIG. 26B is, for example, mounted on a printed circuit board 4702. A plurality of electronic components 4700 which are combined and electrically connected to each other over the printed circuit board 4702 can be mounted on an electronic device. A completed circuit board 4704 is provided in an electronic device or the like.

<Electronic Device>

Described next are electronic devices including the aforementioned electronic component.

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 27A to 27F illustrate specific examples of these electronic devices.

Figure 27A:
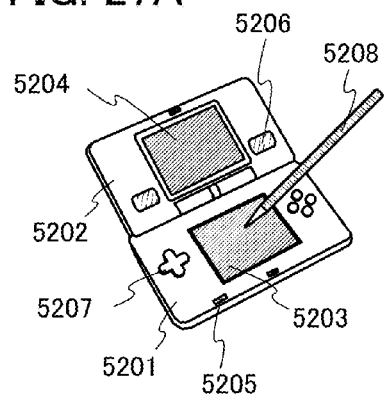
FIGS. 27A to 27F illustrate embodiments of electronic devices.

FIG. 27A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 27A has the two display portions 5203 and 5204, the number of display portions included in a portable game machine is not limited to this.

Figure 27B:
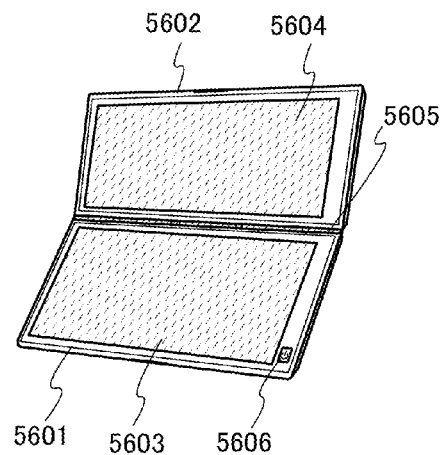

FIG. 27B illustrates a portable information terminal, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 27C:
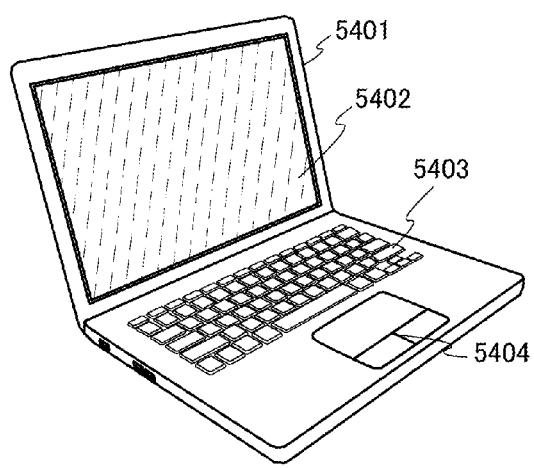

FIG. 27C illustrates a notebook type personal computer, which includes a housing 5401, a display portion 5402, a keyboard 5403, a pointing device 5404, and the like. The semiconductor device of one embodiment of the present invention can be used for a variety of integrated circuits included in notebook type personal computers.

Figure 27D:
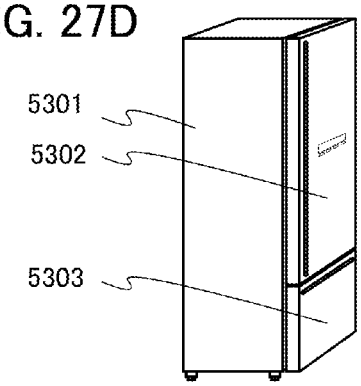

FIG. 27D illustrates an electric refrigerator-freezer, which includes a housing 5301, a refrigerator door 5302, a freezer door 5303, and the like. The semiconductor device of one embodiment of the present invention can be used for a variety of integrated circuits included in electric refrigerator-freezers.

Figure 27E:
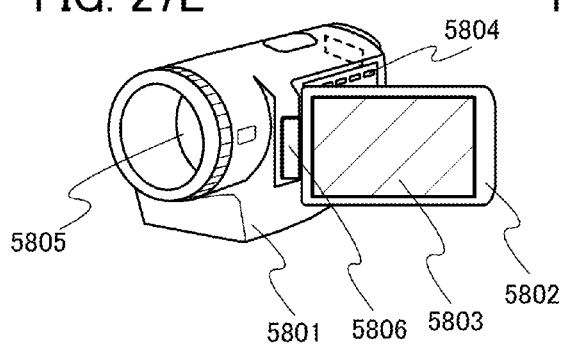

FIG. 27E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 27F:
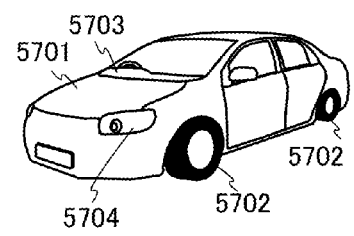
Figure 28A:
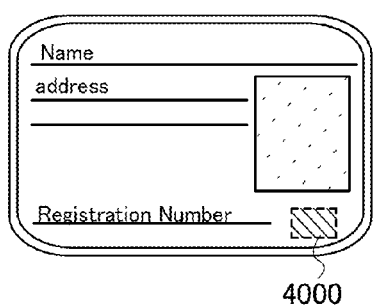
FIGS. 28A to 28F illustrate embodiments of RF tags.
Figure 28B:
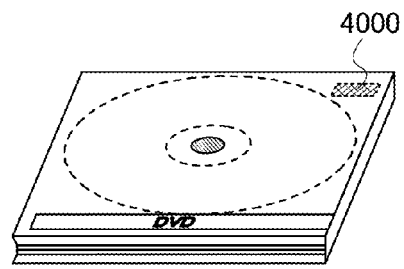
Figure 28C:
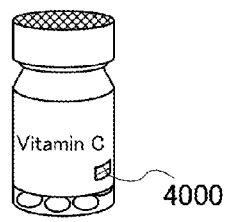
Figure 28D:
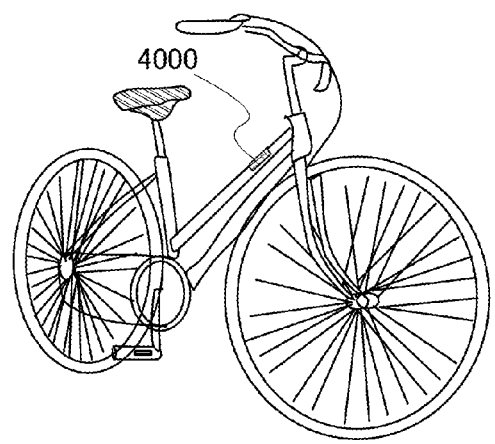
Figure 28E:
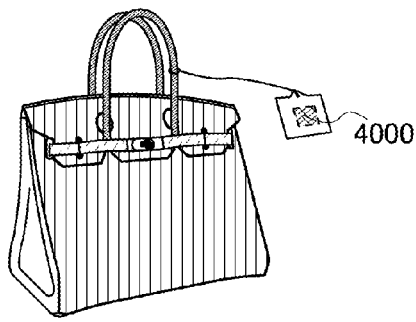
Figure 28F:
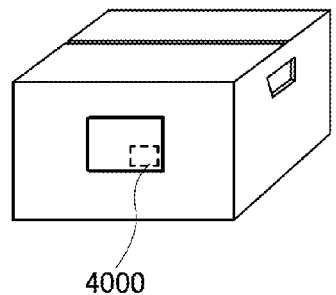

FIG. 27F illustrates a passenger car, which includes a car body 5701, wheels 5702, a dashboard 5703, lights 5704, and the like. The semiconductor device of one embodiment of the present invention can be used for a variety of integrated circuits included in passenger cars.

This embodiment can be combined with any of the other embodiments as appropriate.

Embodiment 9

In this embodiment, application examples of an RF tag which can include the semiconductor device or memory device of one embodiment of the present invention will be described with reference to FIGS. 28A to 28F. The RF tag is widely used and can be provided for, for example, products such as bills, coins, securities, bearer bonds, documents (e.g., driver's licenses or resident cards, see FIG. 28A), recording media (e.g., DVDs or video tapes, see FIG. 28B), packaging containers (e.g., wrapping paper or bottles, see FIG. 28C), vehicles (e.g., bicycles, see FIG. 28D), personal belongings (e.g., bags or glasses), foods, plants, animals, human bodies, clothes, household goods, medical supplies such as medicine and chemicals, and electronic devices (e.g., liquid crystal display devices, EL display devices, television devices, or cellular phones), or tags on products (see FIGS. 28E and 28F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined with any of the other embodiments as appropriate.

Example

In this example, measurement results of characteristics of OS transistors which can be used in the above embodiment will be described.

<Temperature Characteristics>

Figure 29A:
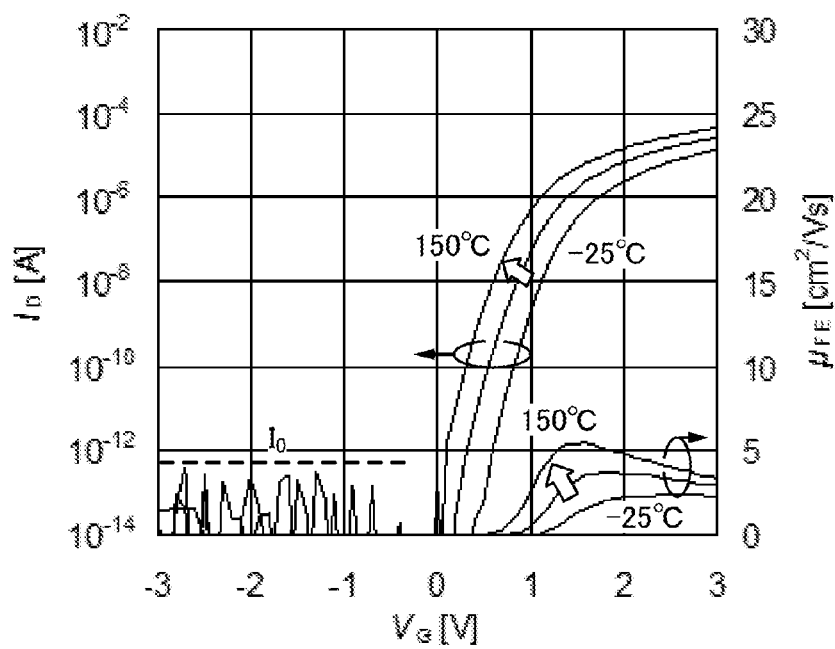
FIGS. 29A and 29B show characteristics of transistors.
Figure 29B:
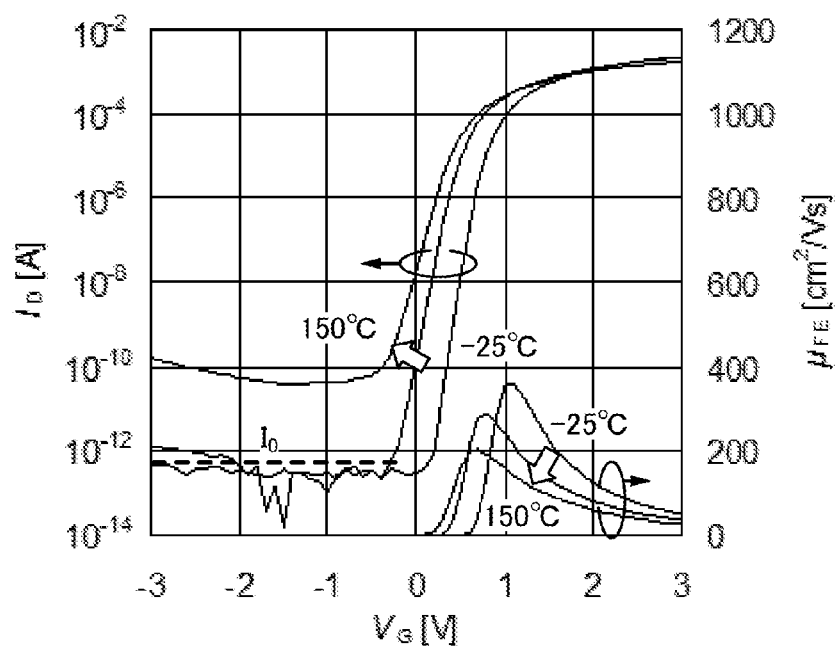

First, temperature characteristics of OS and Si transistors were measured. FIG. 29A shows measurement results of temperature dependences of gate voltage vs. drain current ($V_G$-$I_D$) characteristics and gate voltage vs. field-effect mobility ($V_G$-$\mu_{FE}$) characteristics of an OS transistor. FIG. 29B shows measurement results of temperature dependences of gate voltage vs. drain current ($V_G$-$I_D$) characteristics and gate voltage vs. field-effect mobility ($V_G$-$\mu_{FE}$) characteristics of a Si transistor. FIGS. 29A and 29B show measurement results of these electrical characteristics at temperatures of −25° C., 50° C., and 150° C. The drain voltage $V_D$ is 1 V.

FIG. 29A shows electrical characteristics of the OS transistor that has a channel length L of 0.45 μm, a channel width W of 10 μm, and a gate insulating layer of an oxide film with a thickness $T_{ox}$ of 20 nm. FIG. 29B shows electrical characteristics of the Si transistor that has an L of 0.35 μm, a W of 10 μm, and a $T_{ox}$ of 20 nm.

An oxide semiconductor layer in the OS transistor is made of an In—Ga—Zn-based oxide. The Si transistor is formed using a silicon wafer.

FIGS. 29A and 29B show that the OS transistor has low temperature dependence of rising gate voltage. The off-state current of the OS transistor is lower than or equal to the lower measurement limit ($I_0$) independently of temperature. On the contrary, the off-state current of the Si transistor largely depends on the temperature. According to the measurement results of FIG. 29B, at 150° C., the off-state current of the Si transistor rises, and a sufficiently high current on/off ratio cannot be obtained.

According to the graphs in FIGS. 29A and 29B, when including the OS transistor, the semiconductor device of one embodiment of the present invention can operate even at 150° C. or higher. Thus, the semiconductor device has excellent heat resistance.

<Withstand Voltage>

Figure 30:
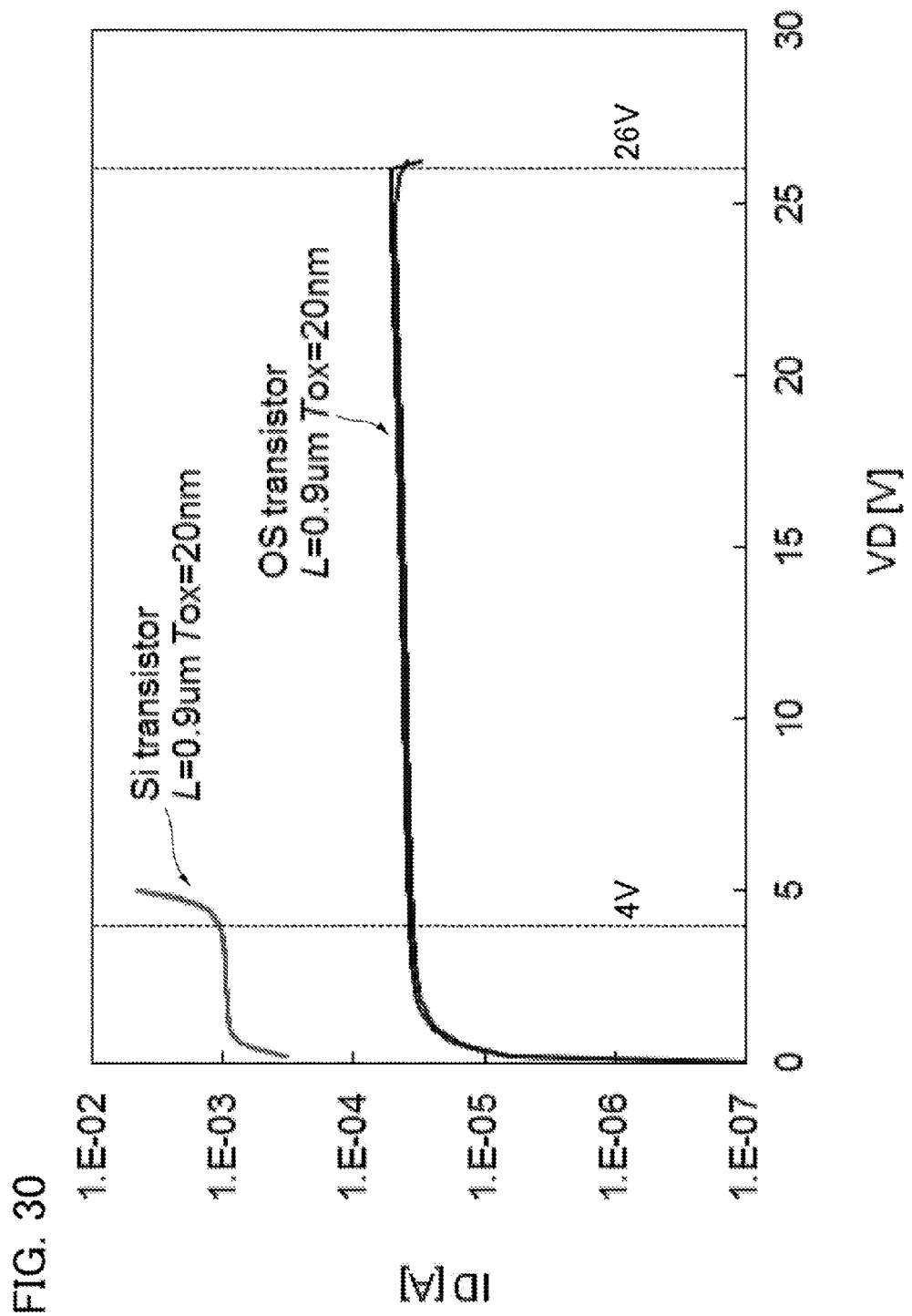
FIG. 30 shows characteristics of transistors.

Next, withstand voltages of OS and Si transistors were measured. FIG. 30 shows measurement results of $V_D$-$I_D$ characteristics of Si and OS transistors. In FIG. 30, to compare withstand voltages of the Si and OS transistors under the same conditions, both of the transistors have a channel length of 0.9 μm, a channel width of 10 μm, and a gate insulating film using silicon oxide with a thickness of 20 nm. Note that the gate voltage is 2 V.

As shown in FIG. 30, avalanche breakdown occurs in the Si transistor at a drain voltage of approximately 4 V, whereas in the OS transistor, a constant current can flow until a drain voltage of approximately 26 V causes avalanche breakdown.

Figure 31A:
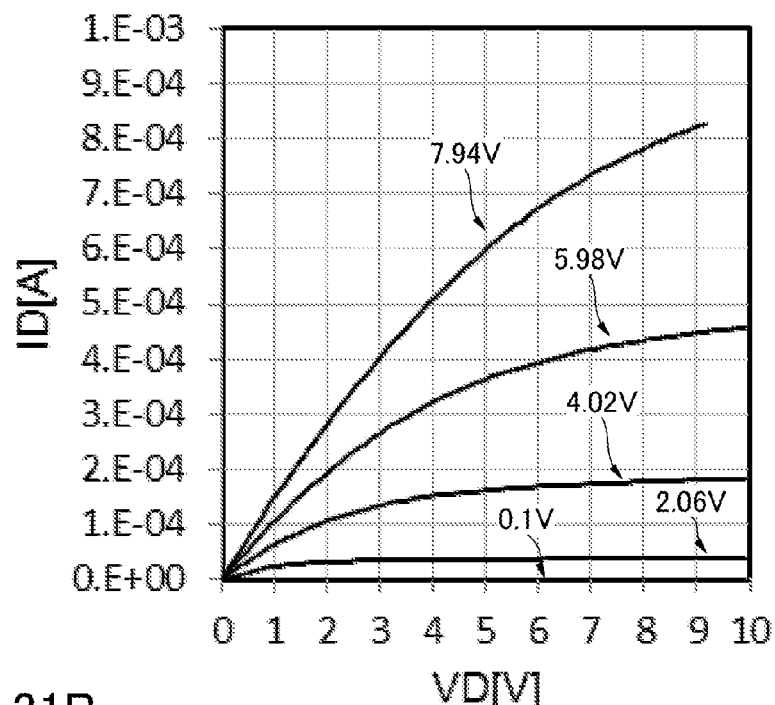
FIGS. 31A and 31B show characteristics of transistors.
Figure 31B:
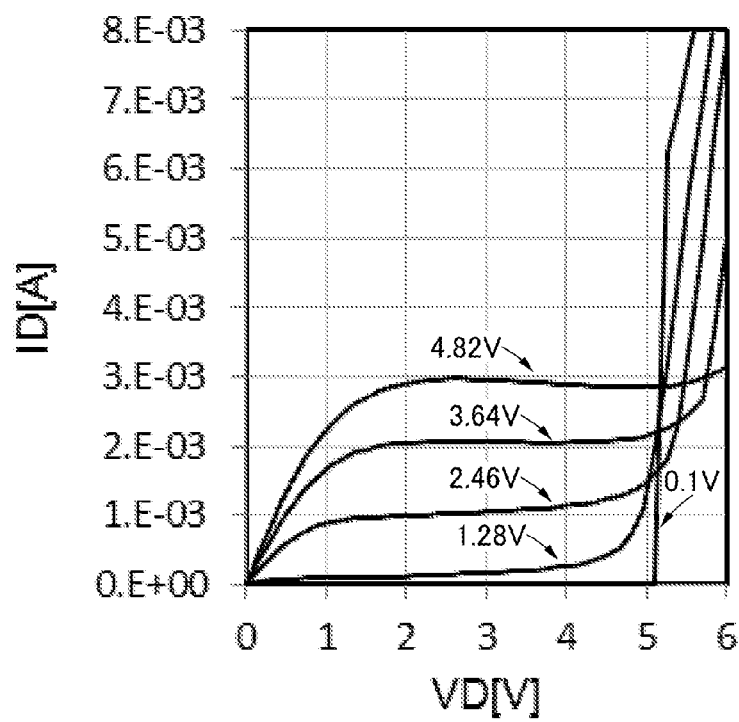

FIG. 31A shows measurement results of $V_D$-$I_D$ characteristics of an OS transistor with varying gate voltage. FIG. 31B shows measurement results of $V_D$-$I_D$ characteristics of a Si transistor with varying gate voltage. Note that to compare withstand voltages of the Si and OS transistors under the same conditions, both of the transistors have a channel length of 0.9 μm, a channel width of 10 μm, and a gate insulating film using silicon oxide with a thickness of 20 nm. The measurement results of the characteristics of the OS transistor in FIG. 31A were obtained at different gate voltages of 0.1 V, 2.06 V, 4.02 V, 5.98 V, and 7.94 V. The measurement results of the characteristics of the Si transistor in FIG. 31B were obtained at different gate voltages of 0.1 V, 1.28 V, 2.46 V, 3.64 V, and 4.82 V.

As shown in FIGS. 31A and 31B, avalanche breakdown occurs in the Si transistor at a drain voltage of approximately 4 V to 5 V, whereas in the OS transistor, a constant current can flow until a drain voltage of approximately 9 V causes avalanche breakdown.

FIG. 30 and FIGS. 31A and 31B show that the OS transistor has a higher withstand voltage than the Si transistor. Therefore, with the use of the OS transistor in the memory cell 21 of one embodiment of the present invention, the range of possible voltages at the node SN can be widened.

This application is based on Japanese Patent Application serial no. 2015-098701 filed with Japan Patent Office on May 14, 2015, the entire contents of which are hereby incorporated by reference.

What is claimed is:

1. A semiconductor device comprising:
   a memory cell comprising a first transistor and a capacitor; and
   a second transistor,
   wherein the first transistor comprises an oxide semiconductor in a channel formation region,
   wherein one of a source and a drain of the first transistor is electrically connected to a first wiring,
   wherein the other of the source and the drain of the first transistor is electrically connected to one of electrodes of the capacitor,
   wherein the other of the electrodes of the capacitor is electrically connected to a second wiring,
   wherein a gate of the second transistor is electrically connected to the first wiring,
   wherein the second wiring is supplied with a first potential based on data to be written to the memory cell,
   wherein the semiconductor device is configured to perform a first operation of supplying a predetermined potential to the one of the electrodes of the capacitor by turning on the first transistor, and
   wherein the semiconductor device is configured to perform a second operation of setting a potential of the one of the electrodes of the capacitor to a third potential by turning off the first transistor after the first operation and by changing a potential of the second wiring from the first potential to a second potential.

2. The semiconductor device according to claim 1,
   wherein one of a source and a drain of the second transistor is electrically connected to a third wiring, and
   wherein the semiconductor device is configured to perform a third operation of setting the potential of the first wiring to a fourth potential and setting the potential of the third wiring to a potential based on the fourth potential by turning on the first transistor.

3. The semiconductor device according to claim 2,
   wherein the data to be written to the memory cell is two or more bits of data, and
   wherein the semiconductor device is configured to sequentially change the potential of the second wiring in reading the data.

4. The semiconductor device according to claim 1, wherein the memory cell is stacked over the second transistor.

5. The semiconductor device according to claim 1, wherein a capacitance of the capacitor is larger than a parasitic capacitance added to the first wiring.

6. A memory device comprising the semiconductor device according to claim 1.

7. An electronic device comprising:
   the semiconductor device according to claim 1; and
   any one of a display portion, a microphone, a speaker, and an operation key.

8. A method for driving a semiconductor device comprising:
   a memory cell comprising a first transistor and a capacitor; and
   a second transistor, wherein the first transistor comprises an oxide semiconductor in a channel formation region,
wherein one of a source and a drain of the first transistor is electrically connected to a first wiring,
wherein the other of the source and the drain of the first transistor is electrically connected to one of electrodes of the capacitor,
wherein the other of the electrodes of the capacitor is electrically connected to a second wiring, and
wherein a gate of the second transistor is electrically connected to the first wiring,
the method comprising the steps of:
performing a first operation of supplying a first potential based on data to be written to the memory cell to the second wiring;
performing a second operation of supplying a predetermined potential to the one of the electrodes of the capacitor by turning on the first transistor;
performing a third operation of turning off the first transistor after performing the first operation and the second operation; and
performing a fourth operation of setting a potential of the one of the electrodes of the capacitor to a third potential by changing a potential of the second wiring from the first potential to a second potential after performing the third operation.

9. The method for driving a semiconductor device according to claim 8, further comprising the step of performing a fifth operation of setting a potential of the first wiring to a fourth potential by turning on the first transistor.

10. The method for driving a semiconductor device according to claim 9,
wherein the data to be written to the memory cell is two or more bits of data, and
wherein the potential of the second wiring is sequentially changed in reading the data.

11. A semiconductor device comprising:
a memory cell comprising a first transistor and a capacitor;
a read circuit comprising a second transistor; and
a control circuit comprising a third transistor,
wherein the first transistor comprises an oxide semiconductor in a channel formation region,
wherein one of a source and a drain of the first transistor is electrically connected to a first wiring,
wherein the other of the source and the drain of the first transistor is electrically connected to one of electrodes of the capacitor,
wherein the other of the electrodes of the capacitor is electrically connected to a second wiring,
wherein a gate of the second transistor is electrically connected to the first wiring,
wherein one of a source and a drain of the third transistor is electrically connected to the first wiring, and
wherein the memory cell, the read circuit and the control circuit are stacked with each other.

12. The semiconductor device according to claim 11, wherein the third transistor is a p-channel transistor.

13. The semiconductor device according to claim 11, wherein a capacitance of the capacitor is larger than a parasitic capacitance added to the first wiring.

14. A memory device comprising the semiconductor device according to claim 11.

15. An electronic device comprising:
the semiconductor device according to claim 11; and
any one of a display portion, a microphone, a speaker, and an operation key.

* * * * *